United States Patent [19]

Fan et al.

[11] Patent Number: 5,467,291

[45] Date of Patent: Nov. 14, 1995

[54] MEASUREMENT-BASED SYSTEM FOR MODELING AND SIMULATION OF ACTIVE SEMICONDUCTOR DEVICES OVER AN EXTENDED OPERATING FREQUENCY RANGE

[75] Inventors: Siqi Fan; David E. Root; Jeffrey W. Meyer, all of Santa Rosa, Calif.

[73] Assignee: Hewlett-Packard Company, Palo Alto, Calif.

[21] Appl. No.: 802,993

[22] Filed: Dec. 5, 1991

Related U.S. Application Data

[63] Continuation-in-part of Ser. No. 756,393, Sep. 9, 1991, abandoned.

[51] Int. Cl.[6] .................................................... G06G 7/62
[52] U.S. Cl. ........................... 364/578; 364/489; 364/490
[58] Field of Search ................................... 364/578, 488, 364/489, 490, 491

[56] References Cited

U.S. PATENT DOCUMENTS

| | | | |
|---|---|---|---|
| 4,933,860 | 6/1990 | Liu | 364/490 |
| 4,939,681 | 7/1990 | Yokomizo et al. | 364/578 |
| 5,025,402 | 6/1991 | Winkelstein | 364/578 |
| 5,031,111 | 7/1991 | Chao et al. | 364/491 |
| 5,046,016 | 9/1991 | Krill et al. | 364/488 |
| 5,047,971 | 9/1991 | Horwitz | 364/578 |
| 5,051,911 | 9/1991 | Kimura et al. | 364/468 |
| 5,146,460 | 9/1992 | Ackerman et al. | 371/23 |

OTHER PUBLICATIONS

Lund et al., "Non-linear modelling of the NE67383 MESFET," *China 1991 International Conference on Circuits and Systems*, Jun. 1991, pp. 196–199, vol. 1.

Struble et al., "Modeling intermodulation distortion in GaAs MESFETs using pulsed I–V characteristics," *13th Annual GaAs IC Symposium Technical Digest 1991*, Oct. 1991, pp. 179–182.

Chen et al., "Novel GaAs FET Modeling technique for MMICs," *GaAs IC Symposium*, Nov. 1988, pp. 49–52.

Vidalou et al., "Accurate nonlinear transistor modeling using pulsed S–parameters measurements under pulsed bias conditions," *1991 IEEE MTT–S International Microwave Symposium Digest*, Jun. 1991, pp. 95–98, vol. 1.

Vandeloo et al., "Modeling of the MOS transistor for high–frequency analog design," *IEEE Transactions on Computer–Aided Design of Integrated Circuits and Systems*, Jul. 1989, pp. 713–723, vol. 8, Iss. 7.

Vendelin, G. D., "Evaluating nonlinear models for microwave GaAsFETs" *IEEE Spectrum*, Sep. 1990, pp. 48–50.

*Primary Examiner*—Jack B. Harvey
*Assistant Examiner*—Jae H. Choi
*Attorney, Agent, or Firm*—William C. Milks, III

[57] ABSTRACT

A modeling system for active semiconductor devices, such as gallium arsenide field effect transistors, for nonlinear (e.g., harmonic balance) circuit simulation. The model enables fast and unambiguous construction (model generation) by explicit calculations applied to raw device response data obtained using an adaptive, automated data acquisition system employed to characterize the device. The automated data acquisition system obtains the data adaptively, taking more data where nonlinearities are most severe and within a calculated, safe operating range of the device. The system converts conventional d.c. and S-parameter data directly into a detailed, device-specific, large-signal model. The system is extremely fast and replaces the need for conventional parameter extraction based on circuit simulation and optimization techniques. The measurement-based model improves large-signal simulation accuracy over an extended operating frequency range, because the model nonlinearities are explicitly constructed from device response data. The model is non quasi-static in that it accounts for frequency dispersion effects. Scaling rules allow devices of various geometries to be simulated from measurements on a single device. Therefore, the model is general, being technology and process independent in that the same calculation procedure applies to any device for which the equivalent circuit is valid. The model implementation in the automated data acquisition system, model generator, and harmonic balance (nonlinear) circuit simulator provides an efficient, practical system for state-of-the-art nonlinear circuit design.

17 Claims, 28 Drawing Sheets

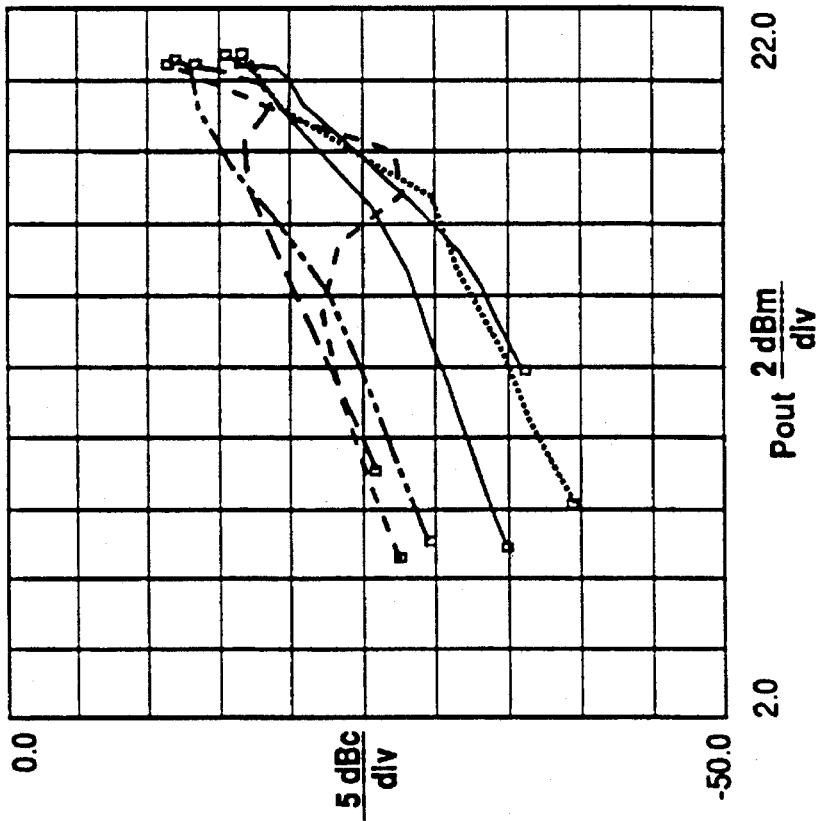
FIG. 11B Second Harmonic
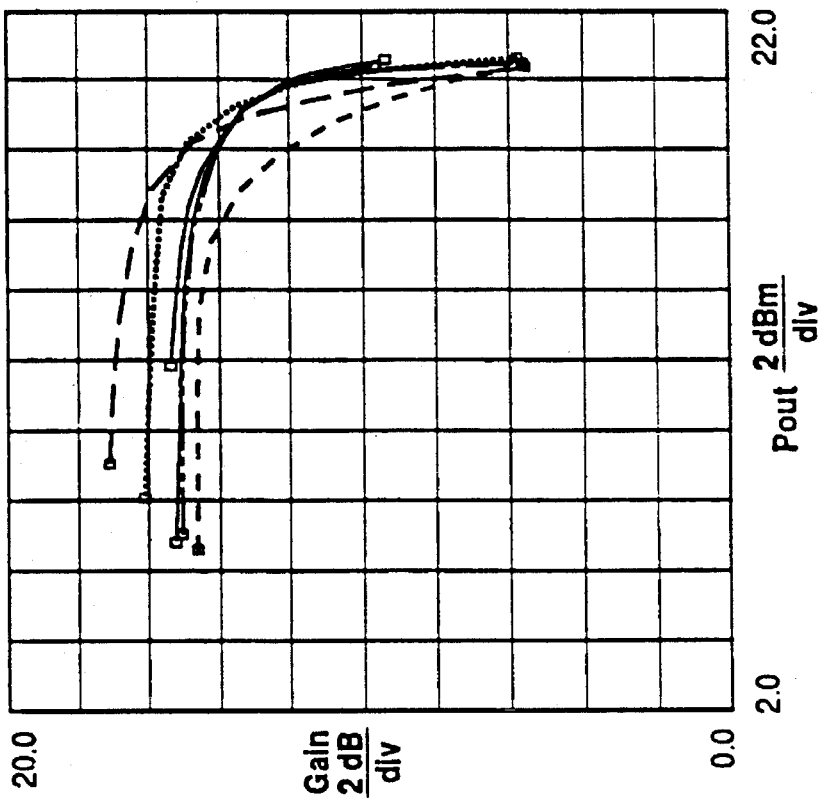
FIG. 11A Gain Compression

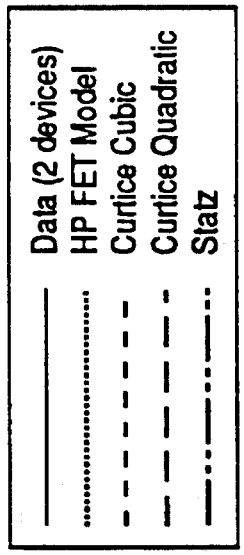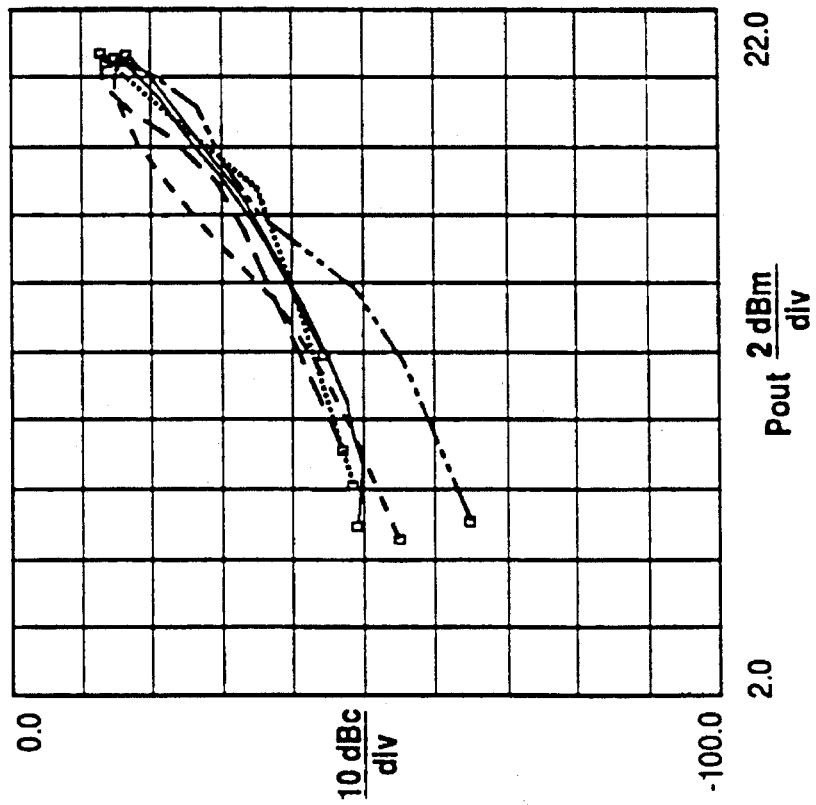
Figure 8. Gain, Second, and Third Harmonic Levels vs. Output Power.
New Model, Curtice Quadratic, Curtice Cubic, Statz, & two measured 0.4μm x 600μm MESFETs with attenuators
$V_D = 2.5$
$I_D = 0.65 \times I_{DSS}$
50 Ohm Load
FIG. 11D
FIG. 11C

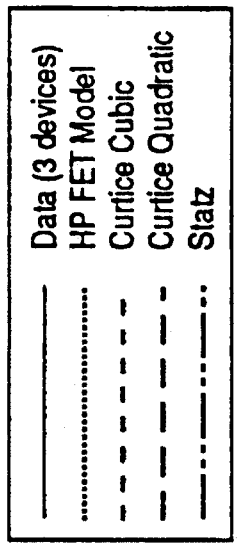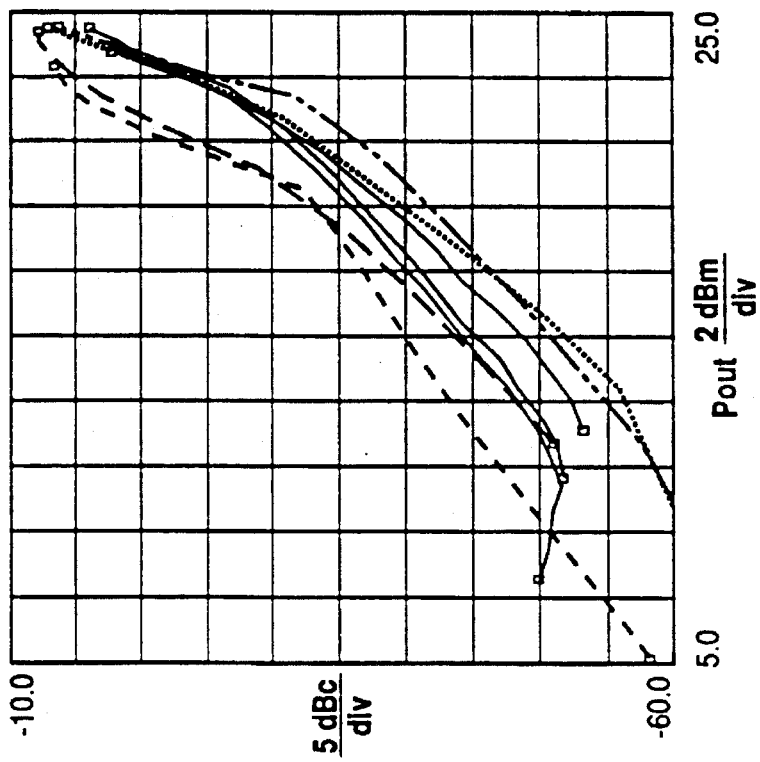
FIG. 12C
FIG. 12D
Figure 9. Gain, Second, and Third Harmonic Levels vs. Output Power:
New Model, Curtice Quadratic, Curtice Cubic, Statz, & three measured 0.4μm x 600μm MESFETs with attenuators
$V_D = 5.0$
$I_D = 0.65 \times I_{DSS}$
50 Ohm Load Gain, Second, and Third Harmonic Levels vs. Output Power:

New Model, and measured MODFET distributed amplifier circuit

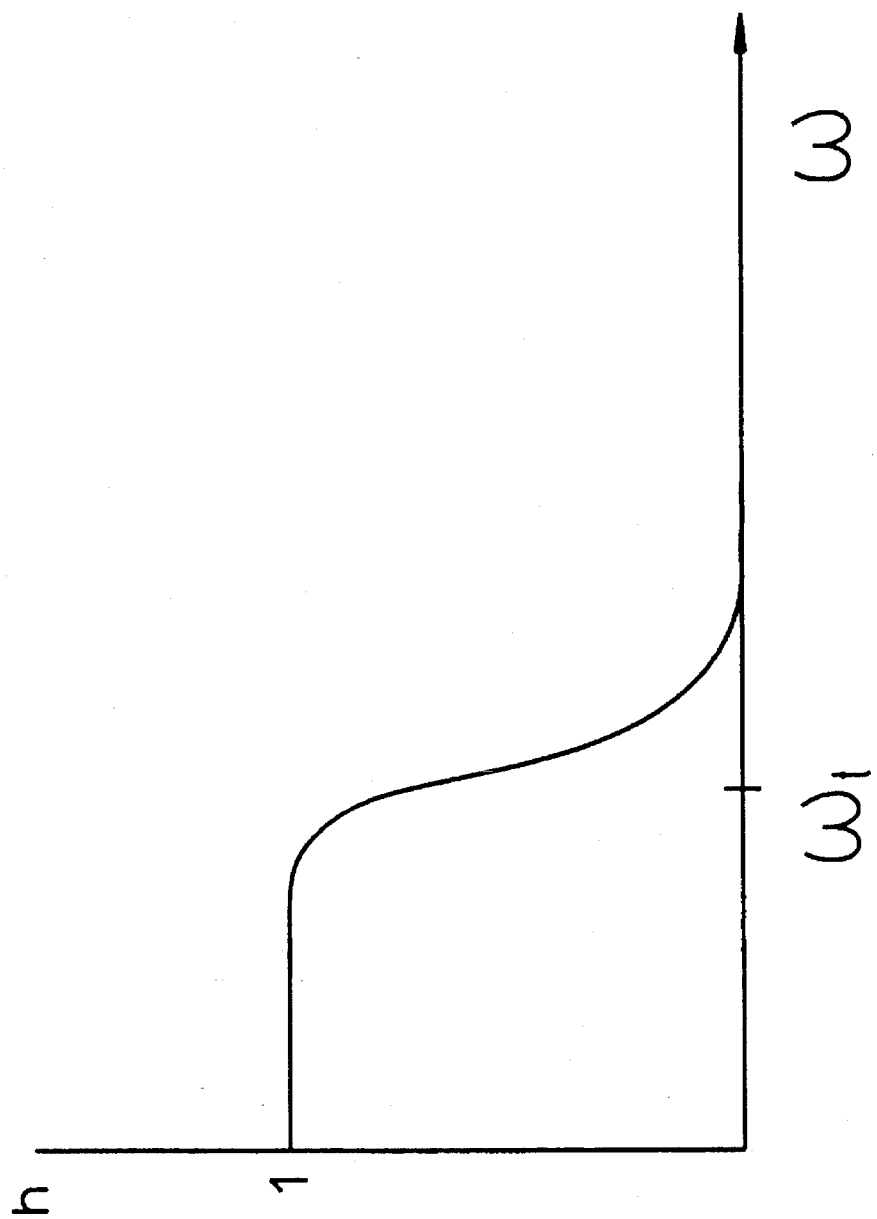

MEASUREMENT-BASED SYSTEM FOR MODELING AND SIMULATION OF ACTIVE SEMICONDUCTOR DEVICES OVER AN EXTENDED OPERATING FREQUENCY RANGE

CROSS-REFERENCE TO RELATED APPLICATIONS

This is a continuation-in-part of U.S. patent application Series Code/Ser. No. 07/756,393 entitled MEASUREMENT-BASED METHOD FOR LARGE-SIGNAL MODELING OF ACTIVE SEMICONDUCTOR DEVICES OVER AN EXTENDED OPERATING FREQUENCY RANGE filed on Sep. 9, 1991, and assigned to the same assignee as this patent application, now abandoned.

BACKGROUND OF THE INVENTION

This invention relates to simulating performance of active semiconductor devices, such as field effect transistors (FETs), and electronic circuits, such as amplifiers, which incorporate such devices and, more particularly, to modeling such devices so that their individual performance, or performance in an electronic circuit, can be precisely simulated on a computer aided engineering (CAE) system, for example, to facilitate design of practical devices and electronic circuits. Specifically, one embodiment of the invention is directed to providing a large-signal model of an active semiconductor device, which faithfully replicates the large-signal performance of the device being simulated over an extended operating frequency range from d.c. (zero Hz) to radio frequencies (e.g., 10 MHz and higher), including microwave and millimeter wave frequencies, during circuit simulation, based to at least some extent on response data measured when controlling bias voltages are applied to an actual physical specimen of the device to be simulated.

For the purpose of description, the method and apparatus for modeling an active semiconductor device in accordance with the invention will be described in connection with providing a large-signal FET model, which is substantially independent of the technology and manufacturing process employed to fabricate the FET. However, the principles of the invention apply to the modeling of other active semiconductor devices, and, therefore, modeling of an FET should be considered exemplary only and not as a limitation of the disclosed method and apparatus in accordance with the invention. Various active semiconductor device models employed for circuit simulation are known. See, for example, Root, D. E., and Kerwin, K. J., "CAD for Microwave Integrated Circuits," *Microwave Integrated Circuits*, ed. Konishi, Marcel Deckker, 1991, pages 573–592.

A large-signal model useful for circuit simulation must accurately and efficiently represent the terminal characteristics of an FET, while maintaining a mathematical compatibility with the model equations solved by a nonlinear circuit simulator incorporated into an associated CAE system which performs a simulation based on the model. Generally, nonlinear circuit simulators solve model equations for equivalent circuits based on Kirchoff's current and voltage laws.

Large-signal FET models for circuit simulation are therefore typically defined based on the equivalent circuit topology of the FET and the specific functional form of the constitutive relationships of nonlinear elements, which specify such functions as model currents and charges in terms of various controlling bias voltages. This provides the requisite compatibility of the model equations for the nonlinear circuit simulator.

However, model equations based on circuit theory are simplistic idealizations. In contrast, partial differential equations of electromagnetism and semiconductor physics can be used to provide a more rigorous model of an FET. These more rigorous model equations, together with details of the manufacturing process for the FET being modeled, can be employed to provide a more complete delineation of the FET and circuit behavior, but, unfortunately, in practice, the resulting model equations are not susceptible to solution by conventional nonlinear circuit simulators.

Therefore, a significant challenge exists in effectively representing so complicated a physical system as an FET or electronic circuit incorporating an FET in terms of circuit theory to provide an acceptable model and also to possess the requisite compatibility with a conventional nonlinear circuit simulator. If equivalent circuits are used, a priori knowledge of the underlying semiconductor physics can aid in the choice of equivalent circuit topology, model equations, and parameter extraction methodology. Also, knowledge of inevitable limitations of the proposed model equations, such as relevant semiconductor physics which are not modeled, is important to understand results obtained during circuit simulation using the adopted model. Nevertheless, fundamental inaccuracies in the model persist.

Consider, for example, the simplified large-signal FET model equivalent circuit shown in FIG. 1. Lumped elements are employed to represent parasitic resistances and inductances, respectively, at the gate, source, and drain terminals of an FET. Branch currents are represented by current source functions $I_{GS}$, $I_{DS}$, and $I_{GD}$. Nonlinear capacitors are represented by charge storage functions $Q_{GS}$, $Q_{DS}$, and $Q_{GD}$. For simplicity, "$R_i$" type elements (i.e., nonlinear losses) are not considered in the basic FET equivalent circuit model shown in FIG. 1.

The manner in which functions $I_{GS}$, $I_{DS}$, $I_{GD}$, $Q_{GS}$, $Q_{DS}$, and $Q_{GD}$ are prescribed for circuit simulation leads to the general classification of model equations for FETs (consistent with this topology) as "physical" or "empirical." The line of demarcation based on this classification is not always clear. Some models have both physical and empirical features. Each model type has its respective advantages and shortcomings, as follows.

Physical models are typified in that the functional forms of the constitutive relationships defining circuit elements of the equivalent circuit are derived from semiconductor physics, and numerical values of the model parameters are obtained from manufacturing process considerations. One well-known example of a physical model is the Shockley model, in which the functional form of the model equations for an FET is based on physical Poisson and current-continuity equations. These model equations invoke simplifying assumptions, such as the known gradual-channel approximation and field-independent mobility, and derive a closed-form expression, for example, for the channel current, $I_{DS}$, as:

$$I_{DS}(V_{GS}, V_{DS}) = \frac{Z\mu q N_D a}{\epsilon L} \left[ V_{DS} - \frac{2}{3} \sqrt{\frac{2\epsilon}{q N_D a^2}} \left[ (V_{DS} + \phi - V_{GS})^{3/2} - (\phi - V_{GS})^{3/2} \right] \right]. \quad (1)$$

The coefficients which appear in the equations of physical models are semiconductor material parameters, such as the dielectric constant, $\epsilon$, and the doping density, $N_D$, and geometrical parameters, such as the depth of the channel, a, and length of the gate L. Within the same approximations, closed-form expressions for other functions, such as $I_{GS}$, $I_{GD}$, $Q_{GS}$, $Q_{DS}$, and $Q_{GD}$, can be expressed in terms of the same physical parameters.

In principle, physical models for an FET can predict circuit-level performance from process and material characteristics without first fabricating and measuring an actual FET. Process variations can be accounted for simply by changing the numerical values of the physical and geometrical parameters which appear in the model equations. For example, increasing the doping density can be reflected in the model parameter $N_D$, which affects the currents through Equation (1), and also affects the corresponding expressions for the nonlinear capacitor constitutive relationship based on $Q_{GS}$, $Q_{DS}$, and $Q_{GD}$. Simulated small and large-signal quantities, such as transconductance, capacitance, output power, and harmonic distortion, are correlated through the mutual dependence of several large-signal model equations based on the same physical and geometrical parameters.

The main disadvantage of existing physical model equations is that the idealized conditions assumed by simple physical model theory rarely rigorously delineate actual FETs. Generally, physical model equations are not sufficiently accurate for quantitative large-signal FET simulation or design of a circuit incorporating such an FET. This is often because insufficient semiconductor physics is factored into the model equations to enable formulation of physical models amenable to circuit simulation. The assumptions of the Shockley model exemplified by Equation (1), for example, are not consistent with various important aspects of semiconductor physics, such as velocity saturation and two-dimensional effects, of present short-gate-length FETs. Moreover, physical models are specific to the FET type and are therefore dependent upon the specific technology and manufacturing process employed to fabricate the FET. For example, separate models are needed for MESFETs and MODFETs.

Furthermore, constitutive relationships within physical models derived from physical considerations may be valid only within a portion of the operating range of the controlling bias voltages. One of several distinct physical mechanisms may be responsible for a given characteristic, such as output conductance. Several breakdown mechanisms may be in effect simultaneously. Furthermore, it may be impractical to obtain precise values of a physical parameter, such as $N_D$, from the manufacturing process. Ultimately, some physical models must be augmented with empirical functions, the parameters of which are selected to replicate FET performance for better quantitative agreement of simulation with actual measured performance characteristics of the FET.

By way of comparison, the constitutive relationships of empirical model equations are employed to represent the most salient nonlinear characteristics of FETs and are typified by the ease with which the associated parameters of the model can be extracted. The well-known Curtice cubic model described in Curtice, W. R., and Ettenberg, M., "A Nonlinear GaAs FET Model for Use in the Design of Output Circuits for Power Amplifiers," *IEEE Trans. MTT*-33, 12, 1985, pages 1383–1393, as exemplified by Equation (2), is an empirical model which provides an expression for channel current defining the voltage-controlled current source element $I_{DS}$ in the equivalent circuit shown in FIG. 1:

$$I_{DS} = (A_0 + A_1 V_1 + A_2 V_1^2 + A_3 V_1^3) \tanh(\gamma V_{DS}), \quad (2)$$

where $V_1$ is an effective gate-source voltage which includes the observed shift of the pinch-off voltage with the drain-to-source voltage, $V_{DS}$. The form of Equation (2), which contains a cubic polynomial and a transcendental function, is not derivable from physical, geometrical, or manufacturing process considerations. That is, the coefficients $A_i$ (i=0, 1, 2, 3, ...) have no physical meaning. The functions and parameters merely form a convenient mathematical expression to replicate a given measured controlling bias voltage dependence of an actual FET.

The most significant advantage of empirical models is generality. The Curtice model exemplified by Equation (2) can be fitted to measured performance data for the drain current characteristics of MESFETs and MODFETs from a variety of doping profiles, but not to the corresponding capacitances. Only the numerical values of the model parameters will differ. In contrast, the physical Shockley model exemplified by Equation (1) is valid only for the long-channel, constant-doped MESFET case.

Since the equations of empirical models are nonlinear in the parameter space, a nonlinear optimization procedure must be used. Numerical values for the parameters of empirical models can be obtained by fitting computed solutions of the model equations to measured performance data using known optimization techniques. This is the conventional parameter extraction procedure shown in FIG. 2. The empirical model parameters are varied until computed solutions exhibit optimum agreement with measured performance data for an actual FET. This requires a time-consuming optimization/solution loop 20. At each iteration (i.e., for every update of the model parameter values), the entire circuit containing the FET model, terminations, etc., must be re-computed by the nonlinear circuit simulator. Often, agreement will never be satisfactory for any value of the model parameters, because the model equations are too restrictive, and the nonlinear optimization techniques are susceptible to local minima which do not reflect the best possible fit. The final result often depends upon the initial guesses of the coefficient values, the range of measured performance data used for comparison to computed solutions, and the range of parameter values allowed during optimization.

The primary disadvantages of empirical models are that they are based on simplistic equations which do not accurately model actual FETs and they are unable to predict changes in FET performance for a given change in the manufacturing process, since empirical model equations are based on coefficients determined to replicate measured performance data, rather than being based on underlying parameters dependent upon the FET geometry or manufacturing process. Another drawback of empirical models is the cumbersome and case-specific nature of the parameter extraction methodology.

A significant advance in microwave circuit simulation has been the ability to insert measured S-parameter data for an active semiconductor device directly into a nonlinear circuit simulator. Such a nonlinear circuit simulator is the HP 85150B microwave design system manufactured by the Network Measurements Division of Hewlett-Packard Company, which is located in Santa Rosa, Calif. This nonlinear circuit simulator accepts amplitude and phase data measured versus frequency. Interpolation between discrete measurement points on an actual FET enables circuit simulations to be performed at frequencies for which there is no actual measured data. In this way, circuits containing active semiconductor devices and structures can be simulated, for which there are measured response data, but for which there are no satisfactory physical or empirical models. However, this nonlinear circuit simulator is limited in that only the linear range of operation of active semiconductor devices can be effectively simulated based on the S-parameter data.

Therefore, there is a need for large-signal modeling over an extended operating frequency range, that overcomes the shortcomings of the physical and empirical models, as well as linear circuit simulation, for providing model equations which model an active semiconductor device for high levels of nonlinearity and, additionally, specify the constitutive relationships of circuit elements, which result in model equations that can be employed in circuit simulation. It is desirable that the large-signal modeling system faithfully represent the performance of the actual active semiconductor device or circuit over a broad range of operating frequencies, large-signal amplitude levels, and operating points. It is also desirable that the associated model equations be compatible with conventional nonlinear circuit simulators so that the modeled active semiconductor device or circuit can be simulated by circuit simulators in present CAE systems.

SUMMARY OF THE INVENTION

One embodiment of the present invention provides generally applicable and accurate, large-signal model equations for nonlinear (e.g., harmonic balance) circuit simulation of an active semiconductor device, such as an FET, for example, a gallium arsenide (GaAs) FET, over an extended operating frequency range. The resulting large-signal model provides fast and unambiguous construction (model generation) by explicit calculations applied to raw measured response data initially obtained when controlling bias voltages are applied to an actual active semiconductor device whose performance is to be simulated. A model generator is provided which is extremely fast and replaces the need for conventional parameter extraction based on circuit solution and optimization techniques embedded in conventional empirical models.

The measurement-based modeling system in accordance with one embodiment of the invention provides broad frequency large-signal models for nonlinear operation of an active semiconductor device based on measured d.c. and S-parameter data versus controlling bias voltages to derive constitutive relationships of equivalent circuit elements, which are functions of intrinsic controlling bias voltages. Dynamic model equations are preferably formulated for the nonlinear circuit simulator in the frequency domain based on these constitutive relationships and spectral weighting functions that allow high-frequency performance to be simulated in addition to low-frequency (d.c.) performance.

All measured and calculated nonlinear model functions defining constitutive relationships of circuit elements are stored in table form as functions of two independent controlling terminal voltages. Two-dimensional spline functions, supported by an associated nonlinear circuit simulator, interpolate the tabulated functions during circuit simulation. The measurement-based modeling system in accordance with the invention also provides a transformation from physical simulations of actual active semiconductor devices to circuit models.

In accordance with one embodiment of the measurement-based modeling system of the invention, an adaptive, automated data acquisition system is also provided to characterize the active semiconductor device being modeled. The automated data acquisition system acquires d.c. and S-parameter data adaptively, that is, measures more data where nonlinearities are most severe and within a calculated safe operating range of the active semiconductor device being measured. The model generator of the measurement-based modeling system then converts the d.c. and S-parameter data directly into a detailed, device-specific, large-signal model for the active semiconductor device.

The measurement-based model in accordance with the invention improves large-signal simulation accuracy, because the model nonlinearities defining constitutive relationships of circuit elements are explicitly constructed from measured response data. The measurement-based model in accordance with the invention is non quasi-static in that it accounts for frequency dispersion effects and, therefore, effectively models active semiconductor devices over an extended frequency range. Scaling rules allow active semiconductor devices having various geometries to be simulated from measurements on a single device.

The measurement-based model in accordance with the invention is general, being independent of the technology on which the design of the active semiconductor device is based. For example, the same calculation procedure applies to any active semiconductor device for which the assumed equivalent circuit is valid, including MESFETs and MODFETs from a wide variety of manufacturing processes.

The measurement-based model in accordance with the invention provides a basis for more accurate simulation of active semiconductor devices over an extended range of operating signal levels and frequencies. Implementation of the model in a measurement-based modeling system comprising the automated data acquisition system, model generator, and a harmonic balance (nonlinear) circuit simulator, provides an efficient, practical system for nonlinear circuit design.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIGS. 11 through 13 compare measured large-signal performance data to harmonic balance simulations using the measurement-based model in accordance with the invention and three representative industry-standard MESFET models described in Curtice, W. R., "A MESFET Model for Use in the Design of GaAs Integrated Circuits," *IEEE Trans. Microwave Theory and Techniques*, MTT-28 (5), 1980, pages 448–456; Curtice, W. R., and Ettenberg, M., "A Nonlinear GaAs FET Model for Use in the Design of Output Circuits for Power Amplifiers," *IEEE Trans. MTT*-33, 12, 1985, pages 1383–1393; and Statz, et al., "GaAs FET Device and Circuit Simulation in SPICE," *IEEE Trans. Electron Devices ED*-34, No. 2, 1987, pages 160–169, respectively;

FIG. 16 is a graph of a function h(ω) which characterizes the dispersion between d.c. and high-frequency currents in an FET.

DETAILED DESCRIPTION OF THE PREFERRED EMBODIMENTS

Figure 1:
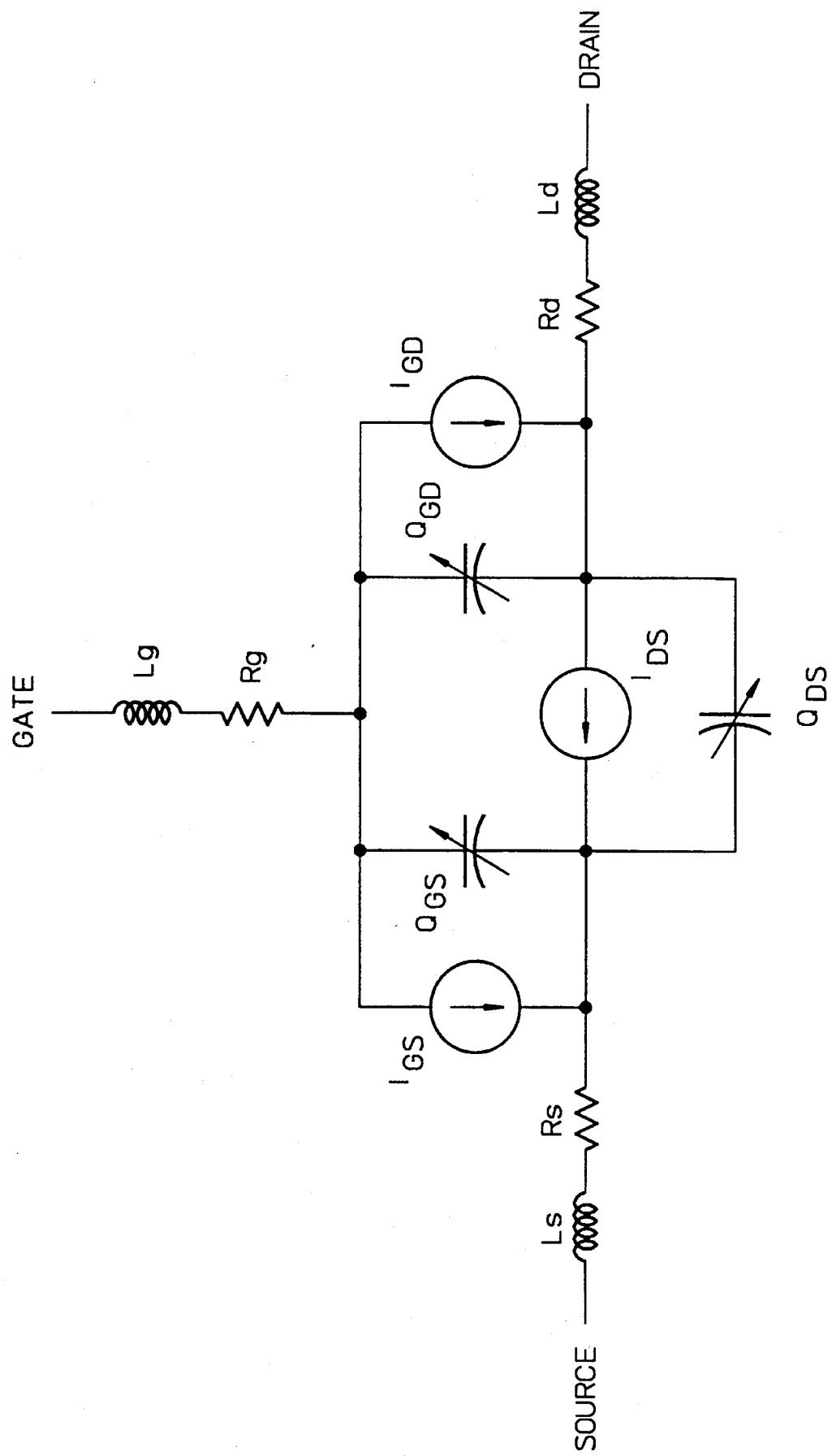
FIG. 1 is an equivalent circuit for a conventional field effect transistor (FET)
Figure 2A:
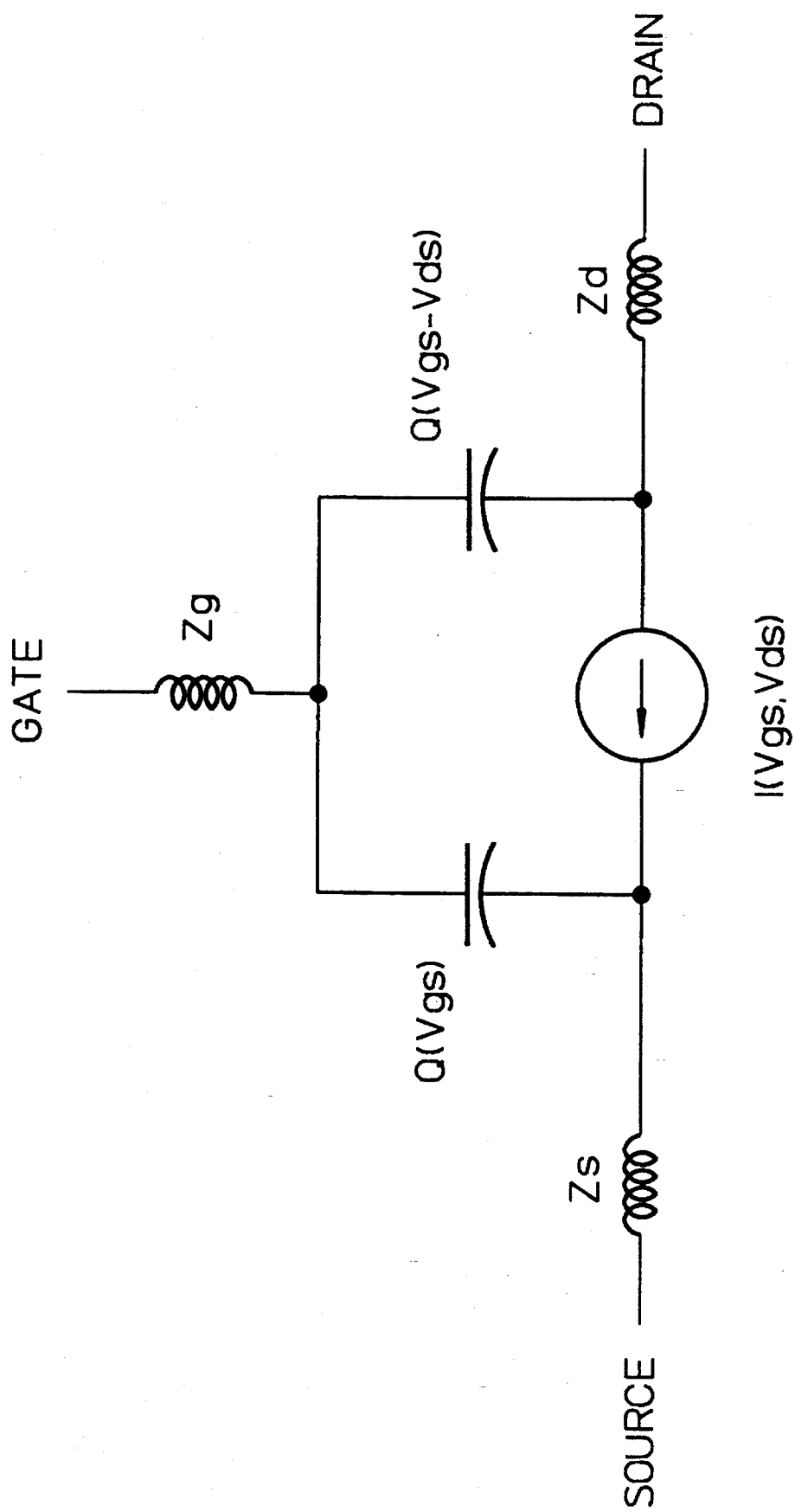
FIG. 2 is a flow chart of a known parameter extraction technique for obtaining parameter values in the model equations of empirical models for an active semiconductor device, such as the FET shown in FIG. 1.
Figure 2B:
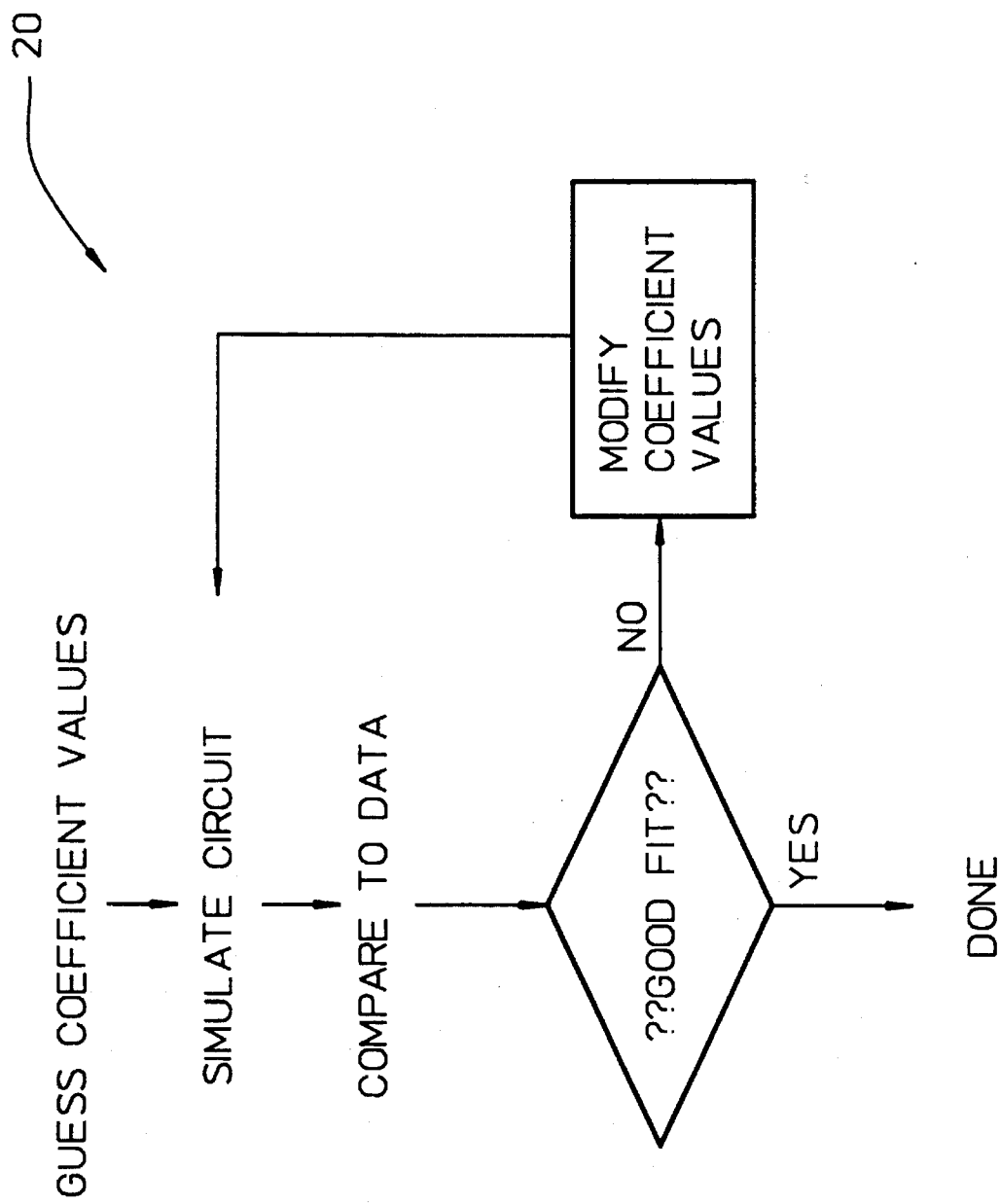

Previously, various physical and empirical models have been proposed for modeling actual active semiconductor devices and electronic circuits that incorporate such devices. Known physical models are based on equivalent circuits for the active semiconductor devices being modeled and dimensional and manufacturing process parameters (i.e., geometrical and fabrication process variables). Measured performance data of the actual active semiconductor device has not been used to generate or derive the model equations employed by physical models. Measured performance data has only been used to verify the device model.

Known empirical models force the constitutive relationships of circuit elements so that simulation is fitted to measured performance data of the actual active semiconductor device in a given operating range over which the performance data is measured. The model equations are device-specific in that they do not effectively allow any change in the parameters of the model equations without fabricating a modified active semiconductor device, measuring the associated modified performance characteristics of the device, and solving the model equations using the new measurements.

One embodiment of the invention provides a large-signal model for an active semiconductor device, such as an FET, which, like a physical model, is based in part on an equivalent circuit for the device being modeled so that the circuit element constitutive relationships can be expressed in a form that is compatible with their use in a conventional harmonic balance (nonlinear) circuit simulator. Also, the large-signal model in accordance with the invention can be considered to be somewhat akin to an empirical model in that the constitutive relationships of circuit elements embodied in the model equations are based on measured data, although the type of measurement data extends beyond the type of measured performance data employed to delineate function equations for conventional empirical models. Specifically, the measurement-based modeling system in accordance with one embodiment of the invention additionally uses S-parameter data in the form of complex matrix-valued functions versus controlling bias voltages, as well as frequency, to derive bias-dependent functions which specify constitutive relationships of the circuit elements of the active semiconductor device being modeled.

The circuit simulation model produced by the measurement-based modeling system in accordance with the invention is more accurate than one based on simplified physical model equations and empirical model equations which are force-fitted to measured performance data. Additionally, the large-signal model in accordance with the invention can be used to encompass semiconductor physics previously ignored by a physical model, or else to correct a deficiency in an empirical model equation. The measurement-based modeling system in accordance with the invention also provides a transformation from physical simulations of actual active semiconductor devices to circuit models.

The following definitions will facilitate an understanding of the measurement-based modeling system in accordance with the invention. "Model equations" are defined, in the time domain, as a relationship which determines all observable properties (the state) of the model at a time t given its state at prior times. The state of the modeled equivalent circuit at any time is typically represented by the value of node voltages and, through the constitutive relationships of the circuit elements, values of the currents, charges, etc., which are determined by evaluating the constitutive relationships of the circuit elements. This generally involves a differential equation for currents at nodes of the circuit and appropriate initial conditions.

"State functions" provide specific mapping from the space of controlling variables (terminal voltages in this case) to the current, charge, etc., domain. These functions will later be operated on by model equations to predict future voltages (and therefore future values of currents and charges) during circuit simulation. In the present case, the state functions are table entries which specify values of $I_d$, $Q_g$, etc., at specific values of the applied, measured controlling bias voltage. State functions define constitutive relationships for circuit elements.

"Constitutive relationships" provide the specification of the relationships between the controlling (independent) variables in the dynamic model equations and the dependent functions, such as current or charge, which are operated upon by dynamic operators, such as d/dt.

"Circuit elements" are specified by two factors. The first is a constitutive relationship relating the independent variables to dependent variables. The second is how the dependent variables enter the model equations which determine the future value of the dependent variables. For example, a capacitor is defined by two factors. First is a relationship in the charge-voltage plane. When this becomes a specific mapping, such as Q= CV, this is a constitutive relationship. The second part is how the dynamic operators act on the dependent variables to produce current. For the capacitor, the current is produced from the specific constitutive relationship by the total time derivative.

The "intrinsic device terminal characteristics" are governed by eight state functions, only five of which are linearly independent. Each of the state functions is a nonlinear function of the intrinsic terminal controlling bias voltages. The state functions define nonlinear constitutive relationships for general, three-terminal, lumped circuit elements. Functions $I_i^{DC}$ (i=G, D, S) model the d.c. nonlinearities.

The measurement-based modeling system in accordance with one embodiment of the invention provides a large-signal model for nonlinear operation of an active semiconductor device based on measured d.c. and S-parameter data versus controlling bias voltages to derive constitutive relationships of equivalent circuit elements, which are functions of intrinsic controlling bias voltages. Dynamic model equations for a nonlinear circuit simulator are preferably formulated in the frequency domain based on these constitutive relationships and spectral weighting functions that allow high-frequency performance to be simulated in addition to low-frequency (d.c.) performance.

The measurement-based modeling system in accordance with the invention is generally applicable because the calculation procedure relating the measured response data to model functions is the same for any active semiconductor device for which the equivalent circuit is valid. Nevertheless, the large-signal model in accordance with the invention is device-specific, because the individual characteristics of the active semiconductor device being modeled, as reflected in the measured response data used to generate the constitutive relationships of the circuit elements of the model, are incorporated directly into the model, with full $V_{GS}$ and $V_{DS}$ dependence in the case of an FET model.

Considered in more detail, in accordance with one embodiment of the method of the invention, a fixed equivalent circuit topology is adopted, as in the case of physical and empirical models. However, the constitutive relationships of the intrinsic equivalent circuit elements are not assumed to have any definite functional form, in contrast to Equation (1) or Equation (2), above. Rather, the functions of the model equations derived in accordance with the method of the invention are the explicitly obtained solutions of algebraic and/or differential equations involving actual measured response data (d.c. and S-parameter data), as will be described below.

In accordance with one embodiment of the measurement-based modeling method of the invention, dynamic model equations are formulated in the frequency domain using spectral weighting. All measured and calculated nonlinear model functions defining constitutive relationships of circuit elements are stored in table form as functions of two independent controlling terminal voltages. Two-dimensional spline functions, supported by an associated nonlinear circuit simulator, interpolate the tabulated functions during simulation. The model can therefore be classified as a lookup-table or table-based model. Lookup-table models use data and interpolation (or approximation) techniques, rather than analytical equations, to define model port relationships or constitutive relationships of circuit elements in an equivalent circuit.

Figure 3A:
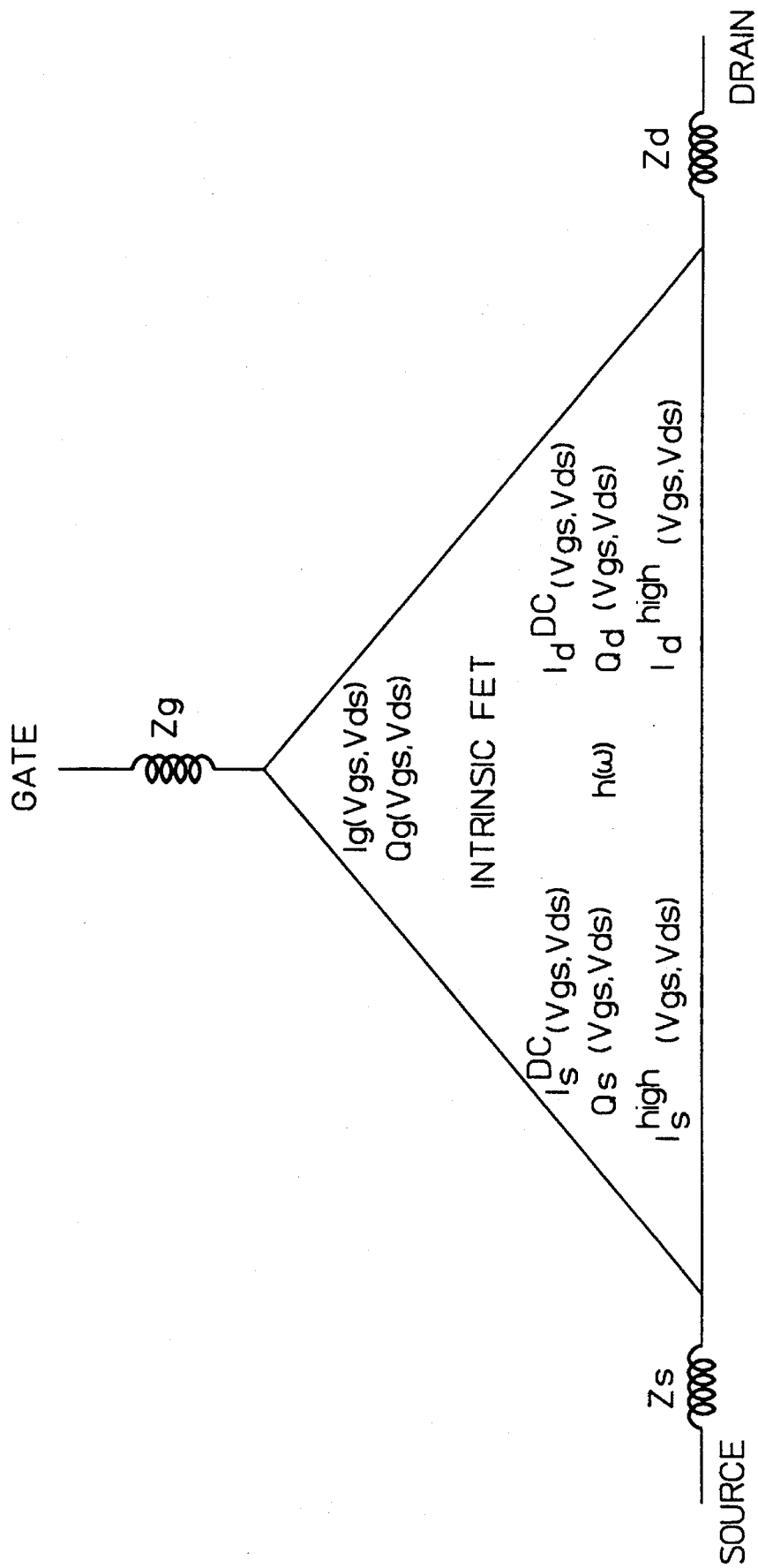
FIGS. 3A, 3B, and 3C illustrate various forms of an equivalent circuit for an FET used in connection with large-signal modeling of an active semiconductor device in accordance with one embodiment of the method of the invention.

For the purpose of description, an FET having an equivalent circuit shown in FIG. 3A will be described in connection with formulation of model equations in accordance with the measurement-based modeling method of the invention. Constant lossy inductive reactances $Z_g$, $Z_s$, and $Z_d$ represent parasitic resistances and inductances at the gate, source, and drain terminals of the FET, respectively, as shown in FIG. 3A. Additionally, parasitic elements are calculated from explicit algebraic transformations applied to measured S-parameter data with the gate forward-biased and intrinsic $V_{DS}$=0 V (cold FET measurements) using the methodology disclosed in Hughes, B., and Tasker, P. J., "Bias Dependence of the MODFET Intrinsic Model Element Values at Microwave Frequencies," *IEEE Trans. on Electron Devices*, ED-36 (10), 1989, pages 2267–2273.

The equivalent circuit model shown in FIG. 3A also comprises three-terminal, charge-based, nonlinear capacitors using the methodology disclosed in Ward, D. E., "Charge-based Modeling of Capacitances in MOS Transistors," Technical Report G201-11, Integrated Circuits Laboratory, Stanford University, June, 1981, and Root, D. E., and Hughes, B., "Principles of Nonlinear Active Device Modeling for Circuit Simulation," *Proc. 32nd IEEE MTT ARFTG Conference*, Tempe, Ariz., 1988, pages 3–26. Accordingly, these capacitances are defined by the functions $Q_i$ (i=G, D, S). These functions, although indexed by the intrinsic circuit nodes, are nearly equivalent to the branch circuit elements in the conventional equivalent circuit topology of an FET, as shown in FIG. 1.

In accordance with the measurement-based modeling method of the invention, the d.c. port currents for the model are derived directly from d.c. response measurements and stored in a model file. Charge functions $Q_i$ (i=G, D, S) for the nonlinear capacitors, and high-frequency current state functions, $I_i^{high}$ (i=D, S), are calculated from the measured S-parameter response data, as follows.

The measurement-based modeling method in accordance with the invention provides a non quasi-static model. Effects of traps and self-heating cause GaAs FET characteristics to appear less than ideal as functions of the d.c. bias voltages. At high frequencies, however, these effects cannot follow the rapid voltage variations, and, therefore, the microwave properties versus controlling bias voltages are, in a sense, less complicated.

It is necessary to accurately model both the d.c. and high-frequency nonlinearities. However, it has been shown that d.c. and high-frequency currents versus controlling bias voltages cannot be consistently simulated by models with a single set of nonlinear functions for the terminal currents. See, Root, D. E., and Hughes, B., "Principles of Nonlinear Active Device Modeling for Circuit Simulation," *Proc. 32nd IEEE MTT ARFTG Conference*, Tempe, Ariz., 1988, pages 3–26.

In accordance with the measurement-based modeling method of the invention, an additional set of nonlinear functions is calculated, that accurately reproduces the measured high-frequency behavior of the conductances of the active semiconductor device being modeled. The derived state functions $I_i^{high}$ (i=D, S) model the nonlinear currents at frequencies $\omega_t$ above the inverse thermal and trap time constants. A function h($\omega$) is also specified, which characterizes the dispersion between d.c. and high-frequency FET currents. h can be defined to be a simple rational function of $\omega$, which smoothly interpolates from unity at d.c. to zero at frequencies slightly greater than $\omega_t$. Alternatively, h($\omega$) can be measured using a low-frequency network analyzer.

In accordance with the measurement-based modeling method of the invention, the large-signal model equation for the intrinsic drain current, $I_D$, is expressed in the frequency domain as:

$$I_D = H(\omega) I_D^{DC}(V_{GS}, V_{DS}) + j\Omega Q_D(V_{GS}, V_{DS}) + (1-H(\omega)) I_D^{high}(V_{GS}, V_{DS}). \quad (3)$$

In Equation (3), all voltages, currents, and charges are to be interpreted as the spectra (Fourier coefficients) of the respective wave forms. $H(\omega)$ is a diagonal matrix with elements $h(n\omega_0)$, $\Omega$ is a diagonal matrix with elements $n\omega_0$, $n=0, 1, 2, \ldots$, with $\omega_0$ being the fundamental frequency. See, Kundert, K. S., and Sangiovanni-Vincentelli, A., "Simulation of Nonlinear Circuits in the Frequency Domain," *IEEE Trans. Computer-Aided Design*, CAD-5 (4), 1986, pages 521–535. Equations similar to Equation (3) model the intrinsic gate and source currents $I_G$ and $I_S$, as well.

One embodiment of the measurement-based modeling method in accordance with the invention will now be described in detail. Initially, the measurement-based modeling method provides dynamic equations which define the model for the nonlinear circuit simulator, in terms of state functions to be calculated from measured response data (and the parameter $\omega_t$ to be specified at circuit simulation time), as indicated by the numeral 42 shown in FIG. 4. For example, one such dynamic equation is illustrated by Equation (4) for the intrinsic drain terminal:

$$\hat{I}_D = H(\omega) \hat{I}_D^{DC}(\hat{V}_{GS}, \hat{V}_{DS}) + j\Omega \hat{Q}_D(\hat{V}_{GS}, \hat{V}_{DS}) + (\Pi - H(\omega)) \hat{I}_D^{high}(\hat{V}_{GS}, \hat{V}_{DS}), \quad (4)$$

where $$\hat{V}_{GS} = \begin{bmatrix} \hat{V}_{-N} \\ \vdots \\ \hat{V}_0 \\ \vdots \\ \hat{V}_N \end{bmatrix} \in \mathbb{C}^{2N+1},$$

$$\Omega = \begin{bmatrix} -N\omega_0 & & & 0 \\ & \ddots & & \\ & & 0 & \\ & & & \ddots \\ 0 & & & N\omega_0 \end{bmatrix},$$

$$h(\omega) = \frac{1}{1 + \left(\frac{\omega}{\omega_t}\right)^2},$$

$$H(\omega) = \begin{bmatrix} h(-N\omega_0) & & & 0 \\ & \ddots & & \\ & & h(0) & \\ & & & \ddots \\ 0 & & & h(N\omega_0) \end{bmatrix}.$$

Similar equations apply for the intrinsic gate and source terminals. Equation (5) below is meant to apply for I replaced by $I_G$, $I_D$, $I_D^{high}$, $Q_G$, $Q_D$, etc., (every state function):

$$\hat{I}(\hat{V}_{GS}, \hat{V}_{DS}) = F \, I(F^{-1}\hat{V}_{GS}, F^{-1}\hat{V}_{DS}) \in \mathbb{C}^{2N+1}, \quad (5)$$

where F=Fourier Transform.

Figure 4:
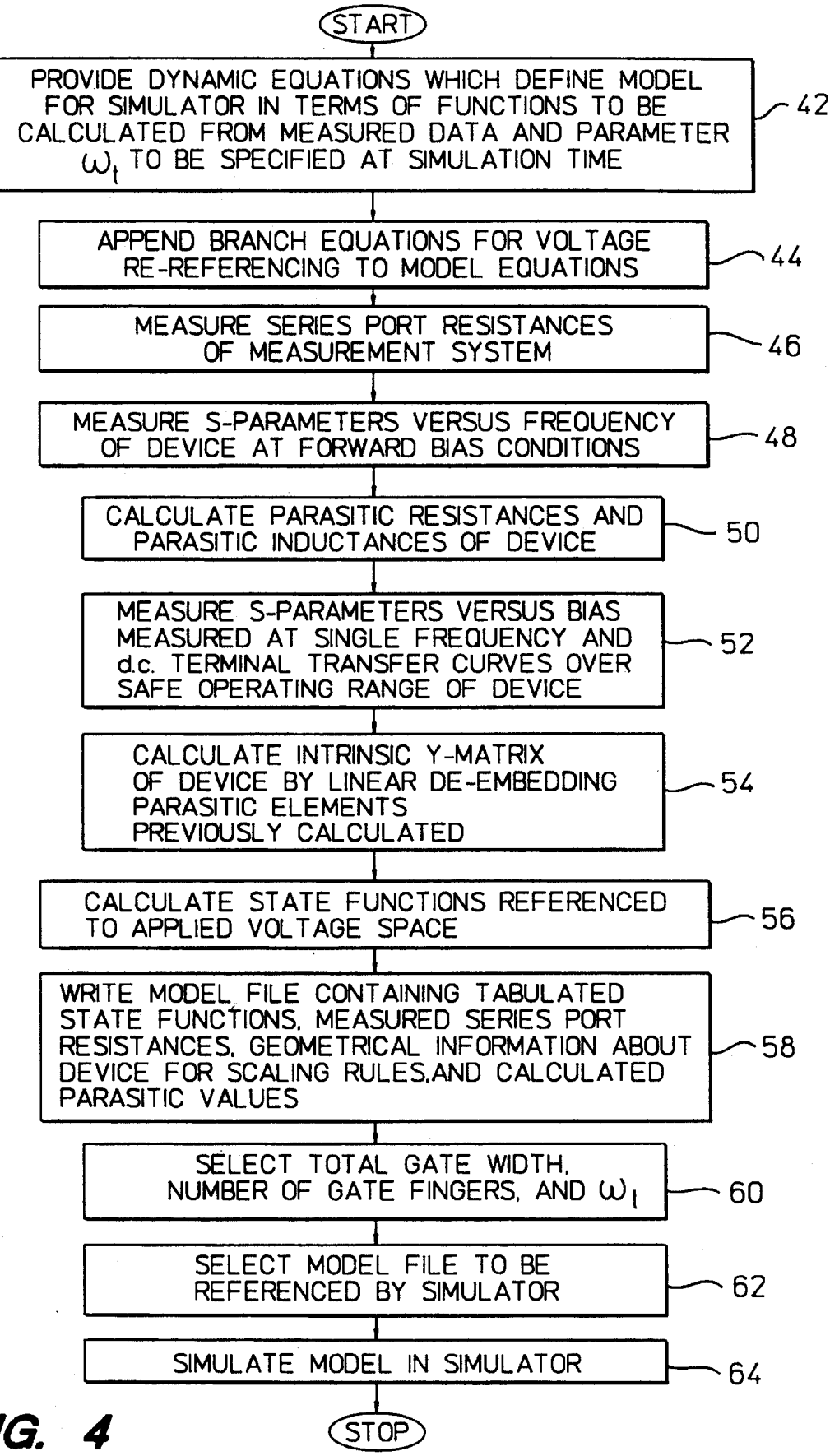
FIG. 4 is a flow chart of one embodiment of the method in accordance with the invention for large-signal modeling often active semiconductor device.

The next step of the measurement-based modeling method in accordance with the invention is to append branch equations for voltage re-referencing to the model equations, as indicated by the numeral 44 shown in FIG. 4. This is given by Equation (6):

$$\begin{bmatrix} V_{GS} \\ V_{DS} \end{bmatrix} = \begin{bmatrix} V_{GS}^m \\ V_{DS}^m \end{bmatrix} - [R] \begin{bmatrix} I_G^{DC}(V_{GS}^m, V_{DS}^m) \\ I_D^{DC}(V_{GS}^m, V_{DS}^m) \end{bmatrix}, \quad (6)$$

where $R_{ij} = Re(Z_{ij}^{Para}) + R_i \delta_{ij}$.

The relationships in Equation (6) are defined in terms of functions to be measured.

The measurement-based modeling method in accordance with the invention then initiates a calculation procedure. This calculation procedure is performed by a model generator, as follows. (The model generator will be described in more detail later.)

Figure 3B:
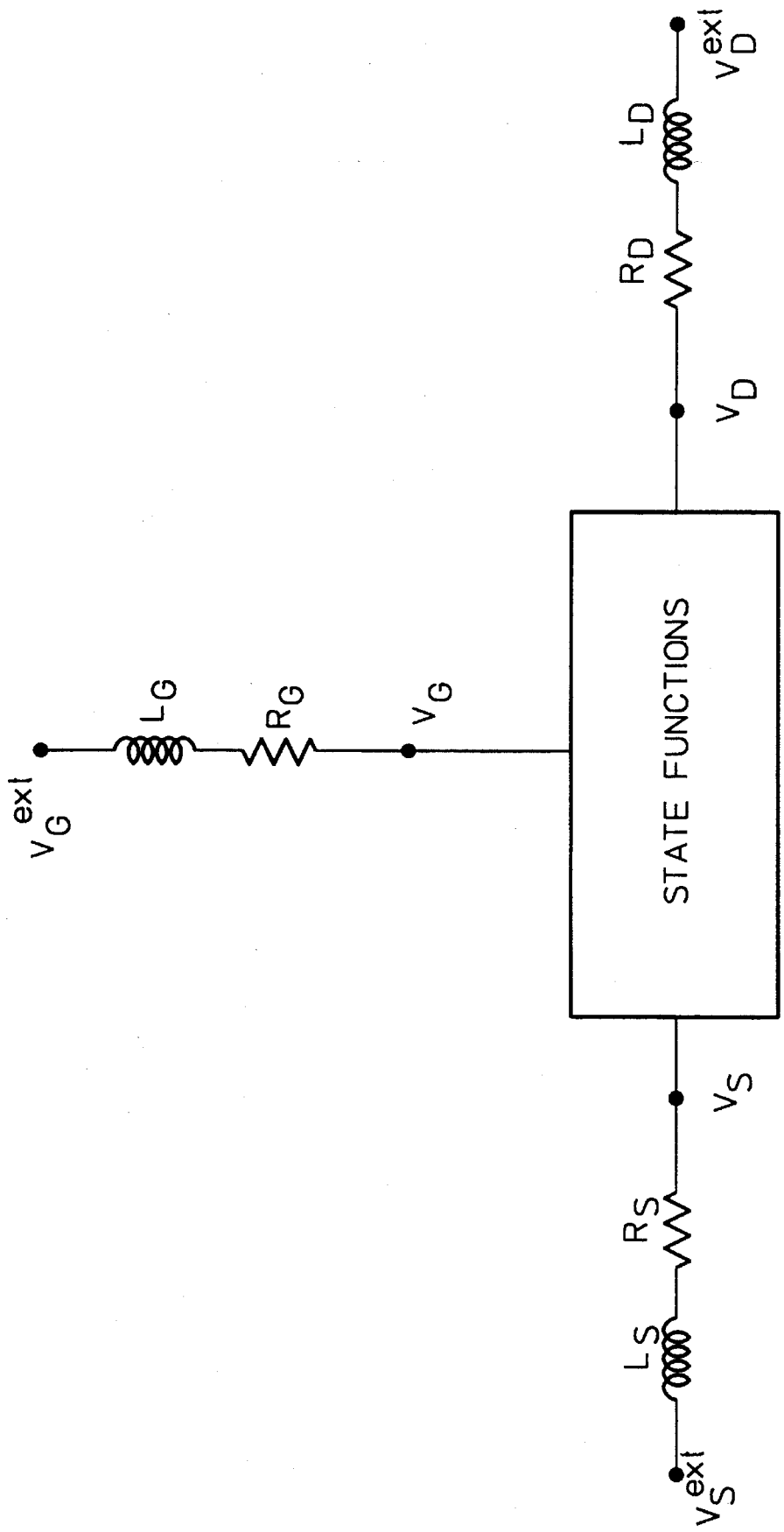
Figure 3C:
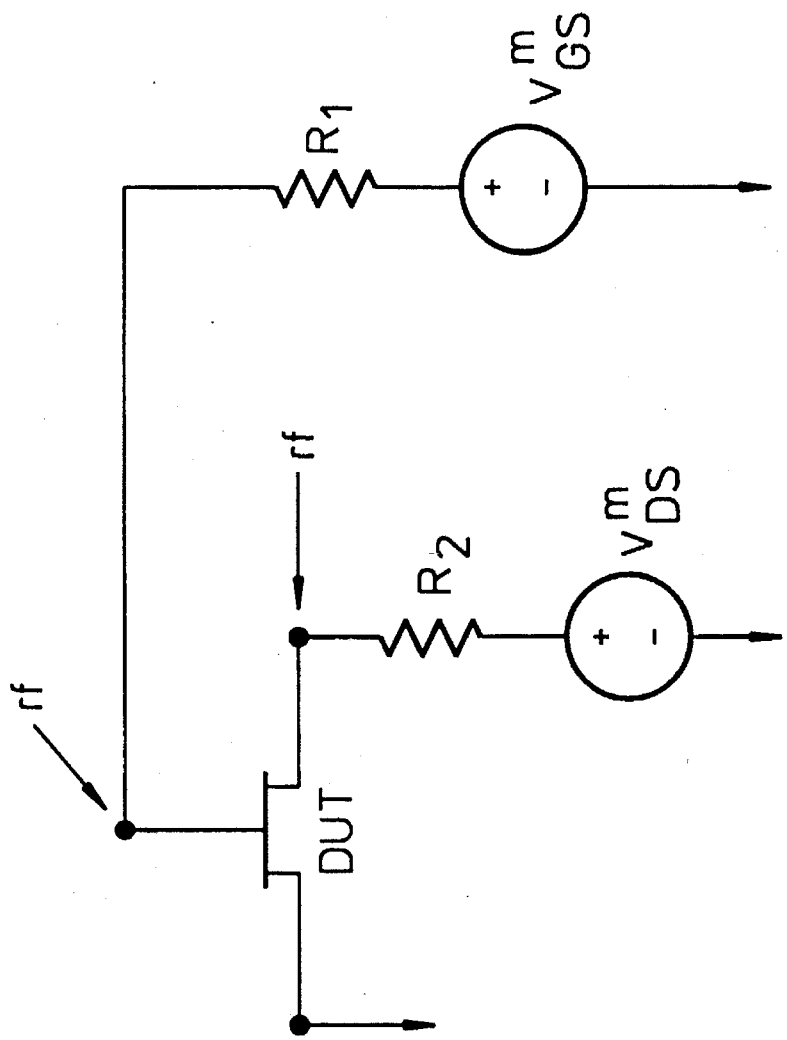

The first step of the calculation procedure is to measure series port resistances, $R_1$ and $R_2$, of a measurement system employed to measure response data, as indicated by the numeral 46 shown in FIG. 4. (See FIG. 3B and 3C for a definition of $R_1$ and $R_2$.) (One embodiment of the measurement system will be described later.)

The next step of the calculation procedure is to measure S-parameters versus frequency at the terminals of the FET being modeled, at forward bias conditions, as indicated by the numeral 48 shown in FIG. 4. The conditions are specified by Equation (7):

$$\bar{S} \text{ biased at } I_G \approx 200 \frac{ma}{mm} \text{ and } I_D = -\frac{1}{2} I_g. \quad (7)$$

Then, parasitic device resistances, $R_G$, $R_D$, and $R_S$, and parasitic device inductances, $L_G$, $L_D$, and $L_S$, are calculated, as indicated by the numeral 50 shown in FIG. 4. The S-parameters are converted to Z-parameters using Equation (8):

$$\bar{Z}(\omega) = 50(\Pi - \bar{S})^{-1}(\Pi + \bar{S}). \quad (8)$$

Thereafter, as indicated by the numeral 52 shown in FIG. 4, the next step of the measurement-based modeling method in accordance with the invention is to measure S-parameters versus applied, measured controlling bias voltages (at a single frequency) and d.c. terminal transfer curves versus applied biases over the entire safe operating range (of bias) of the FET, employing the response measurement system. In this regard, the FET compliances of maximum power, maximum forward $I_G$, and maximum reverse $I_G$, as well as $V_G$ and $V_D$ minimum and maximum, are preferably specified by an automated data acquisition system which forms a portion of the response measurement system, as will be described later.

Then, the intrinsic Y-matrix of the FET is calculated by linear de-embedding of the parasitic elements previously calculated, as indicated by the numeral 54 shown in FIG. 4. This is given by Equation (9):

$$\tilde{Y}(V^{mGS}, V^{mDS}, \omega) = [\tilde{Z}(V^{mGS}, V^{mDS}, \omega) - Z^{Para}]^{-1}, \qquad (9)$$

where $$Z^{Para} = \begin{pmatrix} R_G + R_S + j\omega(L_G + L_S) & R_S + j\omega L_S \\ R_S + j\omega L_S & R_D + R_S + j\omega(L_D + L_S) \end{pmatrix}.$$

The next step of the measurement-based modeling method in accordance with the invention, as indicated by the numeral 56 shown in FIG. 4, is to calculate the state functions, referenced to the applied measured voltage space, according to Equations 10–20, as follows:

$$\tilde{C}_{11}(V_{GS}^{m'}, V_{DS}^{m'}) = \frac{Im\,\tilde{Y}_{11}(V_{GS}^{m'}, V_{DS}^{m'}, \omega)}{\omega} \qquad (10)$$

$$\tilde{C}_{12}(V_{GS}^{m'}, V_{DS}^{m'}) = \frac{Im\,\tilde{Y}_{12}(V_{GS}^{m'}, V_{DS}^{m'}, \omega)}{\omega} \qquad (11)$$

$$\tilde{C}_{21}(V_{GS}^{m'}, V_{DS}^{m'}) = \frac{Im\,\tilde{Y}_{21}(V_{GS}^{m'}, V_{DS}^{m'}, \omega)}{\omega} \qquad (12)$$

$$\tilde{C}_{22}(V_{GS}^{m'}, V_{DS}^{m'}) = \frac{Im\,\tilde{Y}_{22}(V_{GS}^{m'}, V_{DS}^{m'}, \omega)}{\omega} \qquad (13)$$

$$\tilde{g}_m(V^{m'GS}, V^{m'DS}) = Re\,\tilde{Y}_{21}(V^{m'GS}, V^{m'DS}, \omega) \qquad (14)$$

$$\tilde{g}_D(V^{m'GS}, V^{m'DS}) = Re\,\tilde{Y}_{22}(V^{m'GS}, V^{m'DS}, \omega) \qquad (15)$$

$$\left[\frac{\partial \vec{V}}{\partial \vec{V}^m}(\vec{V}^{m'})\right] = \begin{bmatrix} 1 & 0 \\ 0 & 1 \end{bmatrix} - \qquad (16)$$

$$\begin{bmatrix} R_G + R_S + R_1 & R_S \\ R_S & R_D + R_S + R_2 \end{bmatrix}$$

$$\begin{bmatrix} \frac{\partial \tilde{I}_G}{\partial V_{GS}^m}(V_{GS}^{m'}, V_{DS}^{m'}) & \frac{\partial \tilde{I}_G}{\partial V_{DS}^m}(V_{GS}^{m'}, V_{DS}^{m'}) \\ \frac{\partial \tilde{I}_D}{\partial V_{GS}^m}(V_{GS}^{m'}, V_{DS}^{m'}) & \frac{\partial \tilde{I}_D}{\partial V_{DS}^m}(V_{GS}^{m'}, V_{DS}^{m'}) \end{bmatrix}$$

$$d\vec{V}^{m'} = \begin{bmatrix} dV_{GS}^{m'} \\ dV_{DS}^{m'} \end{bmatrix} \qquad (17)$$

$$\tilde{Q}_G(V^{mGS}, V^{mDS}) = \qquad (18)$$

$$\int^{V_{GS}^m, V_{DS}^m} [\tilde{C}_{11}(V_{GS}^{m'}, V_{DS}^{m'})\,\tilde{C}_{12}(V_{GS}^{m'}, V_{DS}^{m'})] \cdot$$

-continued $$\left[\frac{\partial \vec{V}}{\partial \vec{V}^m}(\vec{V}^{m'})\right] \cdot d\vec{V}^{m'}$$

$$\tilde{Q}_D(V^{mGS}, V^{mDS}) = \qquad (19)$$

$$\int^{V_{GS}^m, V_{DS}^m} [\tilde{C}_{21}(V_{GS}^{m'}, V_{DS}^{m'})\,\tilde{C}_{22}(V_{GS}^{m'}, V_{DS}^{m'})] \cdot$$

$$\left[\frac{\partial \vec{V}}{\partial \vec{V}^m}(\vec{V}^{m'})\right] \cdot d\vec{V}^{m'}$$

$$\tilde{I}_{D^{high}}(V^{mGS}, V^{mDS}) = \qquad (20)$$

$$\int^{V_{GS}^m, V_{DS}^m} [\tilde{g}_m(V_{GS}^{m'}, V_{DS}^{m'})\,\tilde{g}_D(V_{GS}^{m'}, V_{DS}^{m'})] \cdot$$

$$\left[\frac{\partial \vec{V}}{\partial \vec{V}^m}(\vec{V}^{m'})\right] \cdot d\vec{V}^{m'}$$

Then, a model file is written, as indicated by the numeral 58 shown in FIG. 4. The model file contains tabulated state function values, measurement series port resistances, geometrical information (i.e., total gate width and number of parallel gate fingers) on the FET for scaling rules, and the calculated parasitic values.

Finally, a circuit simulation is performed. The first step of circuit simulation is to select a total gate width and number of parallel gate fingers of the FET to be simulated and the parameter $\omega_t$, as indicated by the numeral 60 shown in FIG. 4. The next step of circuit simulation is to select the model file to be referenced by the nonlinear circuit simulator for this simulation, as indicated by the numeral 62 shown in FIG. 4. The final step is to simulate as with any other model in the nonlinear circuit simulator, as indicated by the numeral 64 shown in FIG. 4.

Various information is fed to the nonlinear circuit simulator to enable it to solve the model equations. In the time domain, information is fed to the nonlinear circuit simulator about both the particular constitutive relationships of all circuit elements and the form of the dynamic equations to operate on the circuit elements. The nonlinear circuit simulator has conventional built-in algorithms to solve the equations (differential equations in the time domain or algebraic equations in the frequency domain).

Most of the limitations of the measurement-based modeling method in accordance with the invention are also limitations of standard physical and empirical models. Inherent limits on model accuracy are imposed by the equivalent circuit topology and class of nonlinear elements used. This is independent of whether the defining functions are physically derived, empirically specified, or calculated from measured response data using the model generator of the measurement-based modeling system in accordance with the invention. More universal equivalent circuits can be used to extend the range and accuracy of any of these approaches.

Figure 5:
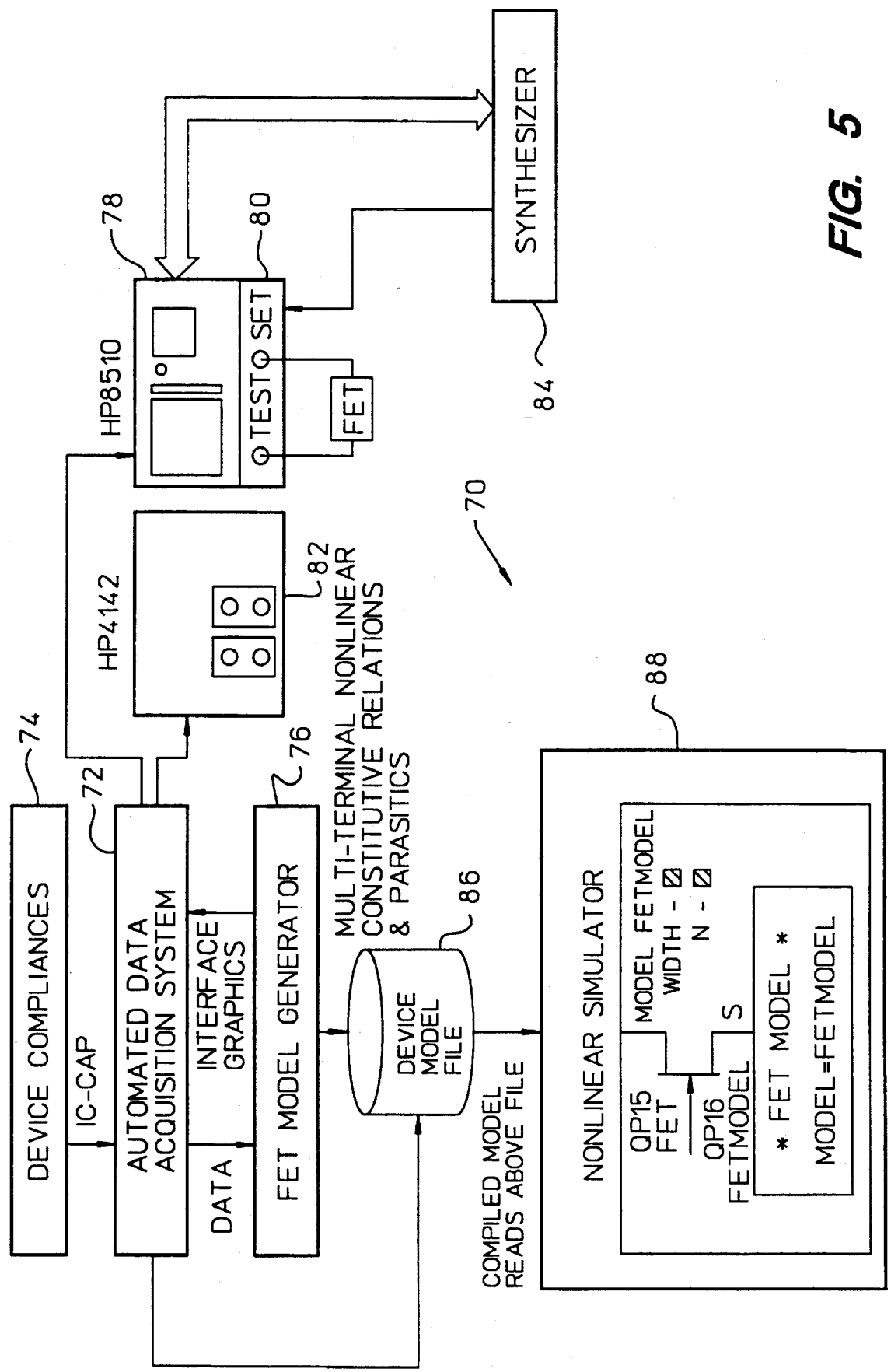
FIG. 5 is a block diagram of one embodiment of the measurement-based modeling system in accordance with the invention, including the automated data acquisition system, model generator, and harmonic balance (nonlinear) circuit simulator.

A diagram of the measurement-based modeling system in accordance with the invention, generally indicated by the numeral 70, is shown in FIG. 5. The measurement-based modeling system 70 comprises an automated data acquisition system 72 for measuring response data needed to construct the model equations described above. Preferably, only minimal information about the active semiconductor device to be measured is needed by the automated data acquisition system 72 to perform the needed response measurements. That is, given very few specifications about the active semiconductor device, for example, the maximum gate current compliance and maximum power dissipation of an FET, the automated data acquisition system 72 automatically computes the safe operating range of the FET, eliminating the need for tedious prescanning measurements. Within this safe operating range, response data is measured adaptively, depending upon the specific nonlinearities of the FET. Data points are selected more densely where nonlinearities are severe, such as the knees of the I-V curves and onset of breakdown, and less densely where the FET characteristics are not changing rapidly. This decreases the measurement time, the storage requirements for the model data files (typically less than 100 kilobytes), and the circuit simulation time.

Preferably, the automated data acquisition system 72 calculates current compliances to maintain measurements within the safe region of FET operation based on parameters provided at an input 74. The automated data acquisition system 72 estimates the local strength of the nonlinearities of d.c. currents and selects the density of sampling points accordingly. After predicting the next measurement point, it acquires the response data and recalculates the local degree of nonlinearity. If this is consistent with the prediction, it proceeds to the next point. Otherwise, it corrects itself and selects a measurement point closer to the previous point.

The automated data acquisition system 72 in accordance with the invention for FET response measurements and its application in connection with the measurement-based modeling system in accordance with the invention will now be described. The large-signal FET model in accordance with the invention described above greatly improves accuracy, because the model nonlinearities are explicitly constructed from measured response data. To achieve this accuracy, software based on the HP IC-CAP program was developed to acquire FET response data and format the data for use in a nonlinear circuit simulator.

The automated data acquisition system 72 in accordance with one embodiment of the invention is an adaptive, automated data acquisition system for on-wafer FET response measurements and for use in connection with the FET model generation process described above. The automated data acquisition system 72 solves the problem of automatically determining the entire, device-specific, safe operating region of the FET being modeled from only data sheet information. The automated data acquisition system 72 adaptively chooses the controlling bias voltages at which to measure, collects d.c. and small-signal S-parameter data, and sends the data to an FET model generator 76, where it is packaged for use with the measurement-based FET model. Because the techniques involved are very general, they can be easily applied for characterizing other classes of active semiconductor devices and to providing FET response data for conventional parameter extraction techniques.

Considered in more detail, as described above, the large-signal FET model in accordance with the invention depends for its accuracy upon large amounts of actual FET response data sampled throughout the entire safe operating range of the FET. Generally, limits on d.c. power dissipation of an active semiconductor device, and maximum forward and reverse gate current, restrict the domain in bias voltage space (spanned by $V_{GS}$ and $V_{DS}$) where the device can be safely operated and characterized. The data domain (set of all points at which the active semiconductor device can be safely biased) has a shape depending upon the detailed nonlinearities of the specific device whose response is being measured. Known data acquisition systems have no capability to determine this domain, nor can they insure that the range of controlling bias voltages selected for measurement is broad enough to insure all relevant regions of operation (breakdown, pinch-off, etc.) are measured. Tedious, interactive prescanning often must be performed simply to establish the range of controlling bias voltages and associated compliance values to use for detailed measurements. This whole procedure must often be repeated for each operating region of interest. Finally, variations from one active semiconductor device to another may require substantial adjustment in the setup for a particular region, such as breakdown.

In most cases, conventional device characterization consists of several setups, where controlling bias voltages (usually $V_{DS}$ and $V_{GS}$ for FETs) are swept over a rectangular subset of bias voltage space in equally spaced increments. Selecting uniformly spaced controlling bias voltages ignores the fact that in some regions of operation the FET characteristics are changing very rapidly, while in other regions there is relatively little change of these characteristics with bias voltage. This results in unnecessary data collection in some regions, and perhaps not enough in other regions.

Also, a single set of compliance limits, expressed in terms of current or voltage, must typically be fixed for each setup. That is, all desired controlling bias voltages in the rectangular portion of bias voltage space have the same current compliance value. This often precludes valuable data near the edge of the safe operating region from being measured at all. But, it is measurement data at precisely these controlling bias voltages which are among the most important for predicting large-signal FET behavior at very large compression.

The automated data acquisition system 72 in accordance with the invention insures that all measurements are performed within the device-specific safe operating range of the FET, which becomes a device under test (DUT) when its response is measured, without the need for tedious, interactive prescanning. The distribution of controlling bias voltages is determined by the automated data acquisition system 72 adaptively, depending upon the specific nonlinearities of the FET whose response is being measured. The automated data acquisition system 72 is configured to accept as input the general constraints of an FET manufacturing process, as reflected in data sheet information, while simultaneously accommodating the detailed nonlinear signatures and variations of individual FETs.

The distribution of data points obtained by the automated data acquisition system 72 in accordance with the invention, based on the local degree of FET nonlinearity, provides good approximation of the device-specific nonlinearities with a minimum number of points. This saves measurement time, storage requirements, and even circuit simulation speed for the measurement-based modeling system 70 in accordance with the invention, which preferably employs the automated data acquisition system 72.

Considered in more detail, the automated data acquisition system 72 in accordance with the invention preferably comprises an HP 8510 or HP 8753 network analyzer 78, an HP 8515 S-parameter test set 80, which is modified to eliminate the 1MΩ shunt resistors, an HP 4142 d.c. source/monitor 82, an HP 8360 or HP 8340 synthesizer 84, which serves as the source for the HP 8510 or HP 8753 network analyzer for stimulating the FET, and an HP 9000 375 computer executing HP_UX. The automated data acquisition system 72 drives the HP 4142 d.c. source/monitor and HP 8510 or HP 8753 network analyzer which acquires d.c. currents and S-parameters at each controlling bias voltage selected adaptively by a program executed by the automated data acquisition system.

The model generator 76 calculates nonlinear intrinsic model functions directly from the measured response data and creates the look-up table for the nonlinear circuit simulator. The model generator 76 preferably comprises the HP 9000 375 computer executing HP_UX.

The measurement-based modeling system 70 in accordance with the invention is implemented as customized code attached to an HP IC-CAP program. IC-CAP is used as a front end (user interface) and as the drivers for the instruments, such as the HP 8510 or HP 8753 network analyzer and HP 4142 d.c. source/monitor. The automated data acquisition system 72 places data in the appropriate form for use by the model generator 76, the calculations of which are also controlled by the user through the IC-CAP front end.

The automated data acquisition system 72 in accordance with the invention operates as follows. The adaptive bias-voltage-point selection methodology is based on a predictor-corrector algorithm, similar to that used by transient analysis circuit simulators to solve nonlinear ordinary differential equations. In the present application, an estimate of the local degree of nonlinearity is used to predict the next controlling bias voltage at which to measure. A measurement is then performed at the predicted point, and a corrector is evaluated. The program may decide that an additional controlling bias voltage closer to the previous one is needed. In most instances, the predicted bias voltage point is the one selected. The maximum number of corrector evaluations for each new bias voltage point is one, so the bias voltage point prediction/selection algorithm is extremely efficient. The algorithm uses a hybrid second and third order method. No a.c. measurement is acquired, unless a bias voltage point is selected.

Figure 6:
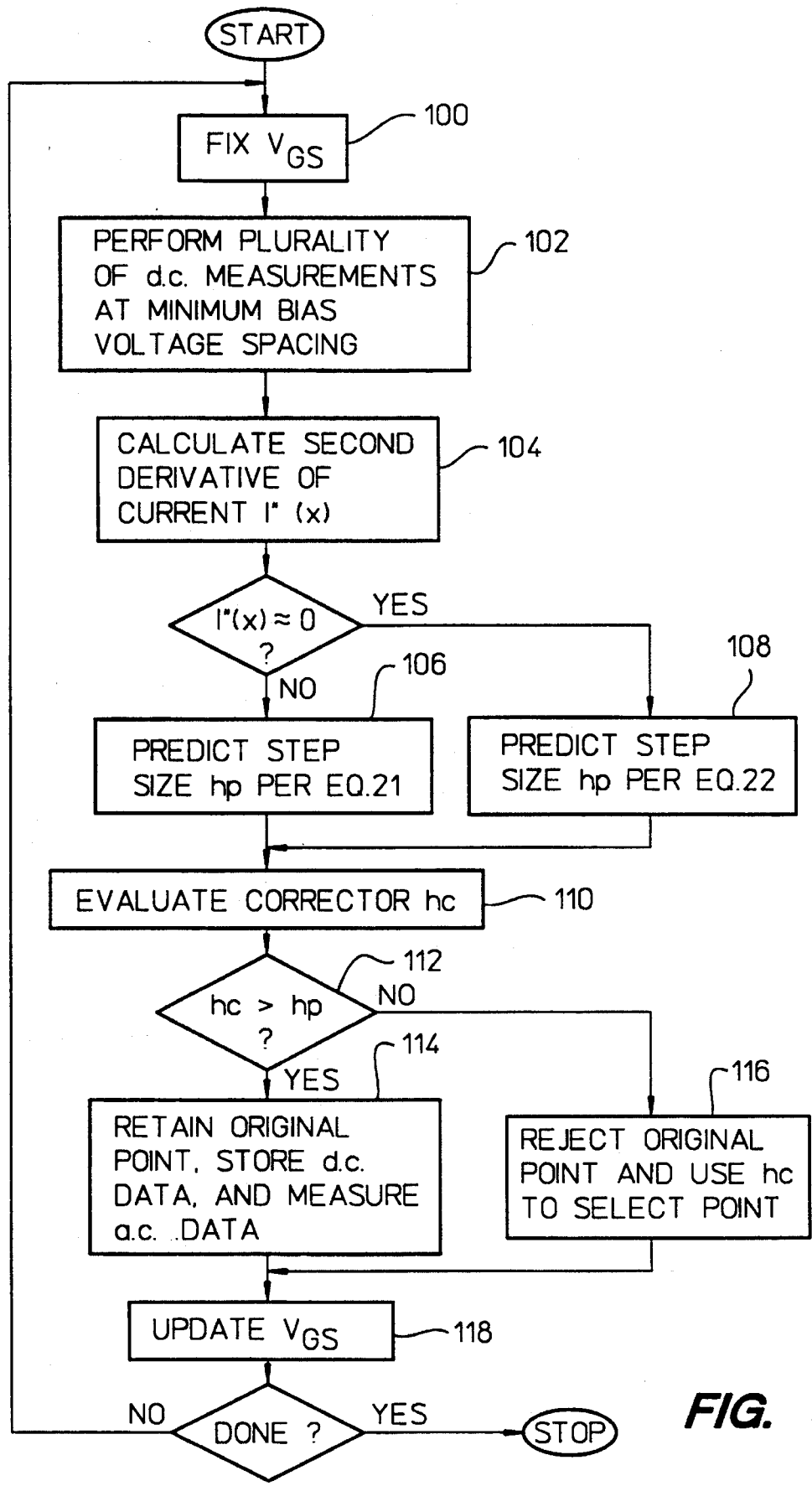
FIG. 6 is a flow chart of adaptively controlling bias voltage selection in connection with one embodiment of the method in accordance with the invention for automated acquisition of FET response data during application of controlling bias voltages.

The automated data acquisition method in accordance with the invention is illustrated by the flow chart which appears in FIG. 6. Initially, $V_{GS}$ is fixed, as indicated by the numeral 100 shown in FIG. 6. Then, a plurality of, for example, three, d.c. measurements separated by a predetermined minimum spacing are performed, as indicated by the numeral 102 shown in FIG. 6. Next, a discrete approximation to the second derivative $I''(x)$ is calculated, as indicated by the numeral 104 shown in FIG. 6. Thereafter, a step size is predicted according to T,330
as indicated by the numeral 106 shown in FIG. 6. $\epsilon$ is the relative error defined by the user. I represents either gate or drain current. If $I''(x) \approx 0$, then $$h_p = \sqrt[3]{\frac{6\epsilon}{I'''}},$$

as indicated by the numeral 108 shown in FIG. 6. Next, the corrector $h_c$ is evaluated using the same formula as before, but by using the most recently measured three points, as indicated by the numeral 110 shown in FIG. 6. Then, a comparison is performed, as indicated by the numeral 112 shown in FIG. 6. On the one hand, if $h_c > h_p$, then the original point is retained, the d.c. data is stored, and the a.c. data is measured, as indicated by the numeral 114 shown in FIG. 6. On the other hand, if $h_c \leq h_p$, then the original point is rejected, and $h_c$ is used to select the point, as indicated by the numeral 116 shown in FIG. 6.

Thereafter, $V_{GS}$ is updated, and the process is repeated until measurements are obtained for the entire range of $V_{GS}$. The steps in $V_{GS}$ are broken down into several regions, each with their own step size calculated from the data sheet information.

The pseudo code for the automated data acquisition method in accordance with the invention is shown in Appendix I.

The net result of the adaptive bias-voltage-point selection method in accordance with the invention is that controlling bias voltages are selected where the nonlinearities are changing most rapidly. This is the case at the onset of breakdown, forward diode conduction, knee of I-V curves, etc. When the FET characteristics are not changing rapidly with bias voltage, such as in the middle of the saturated region, less data is required, so less data is measured.

Figure 7:
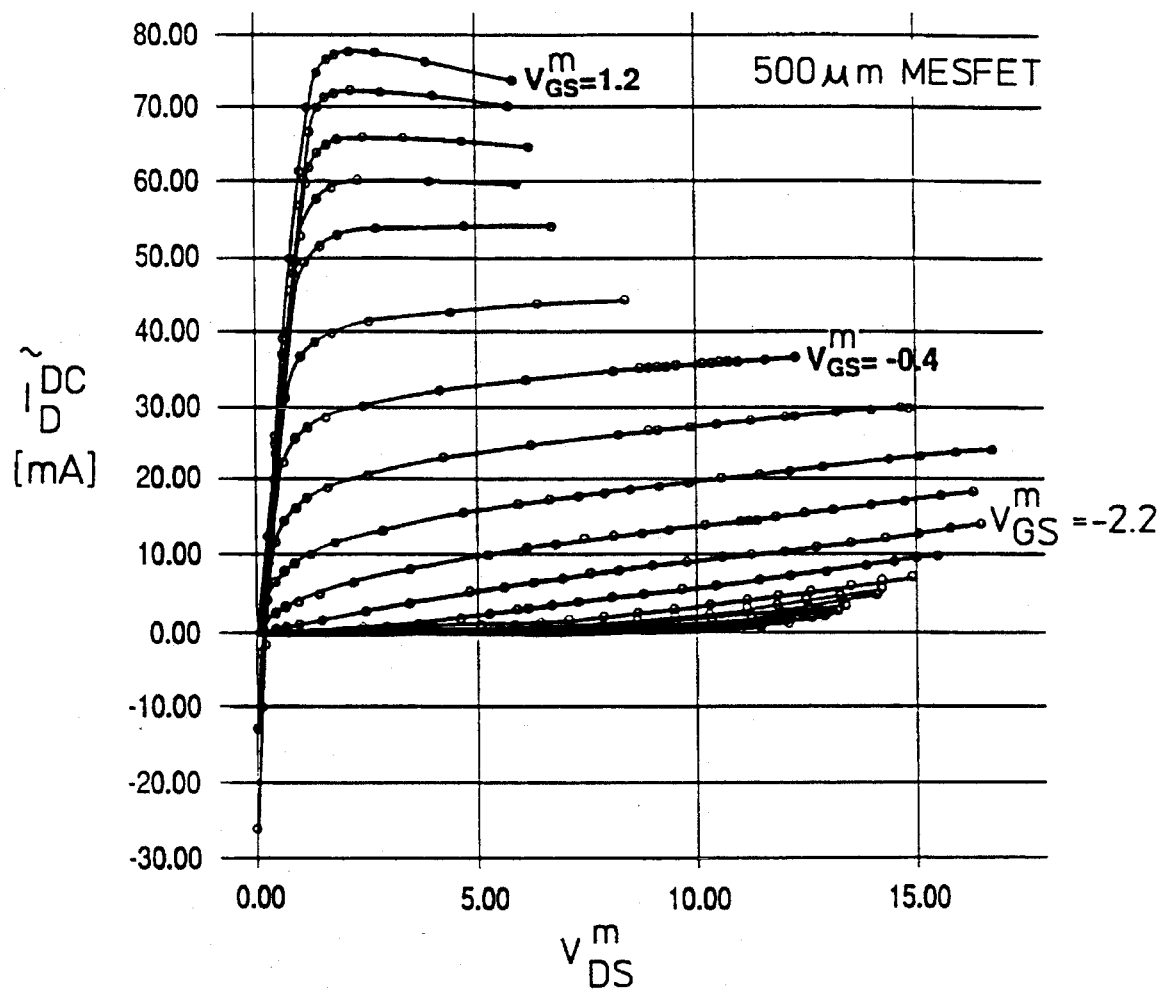
FIG. 7 illustrates d.c. I-V transfer curves for a 500 μm MESFET sampled by the automated data acquisition system in accordance with one embodiment of the invention.
Figure 8:
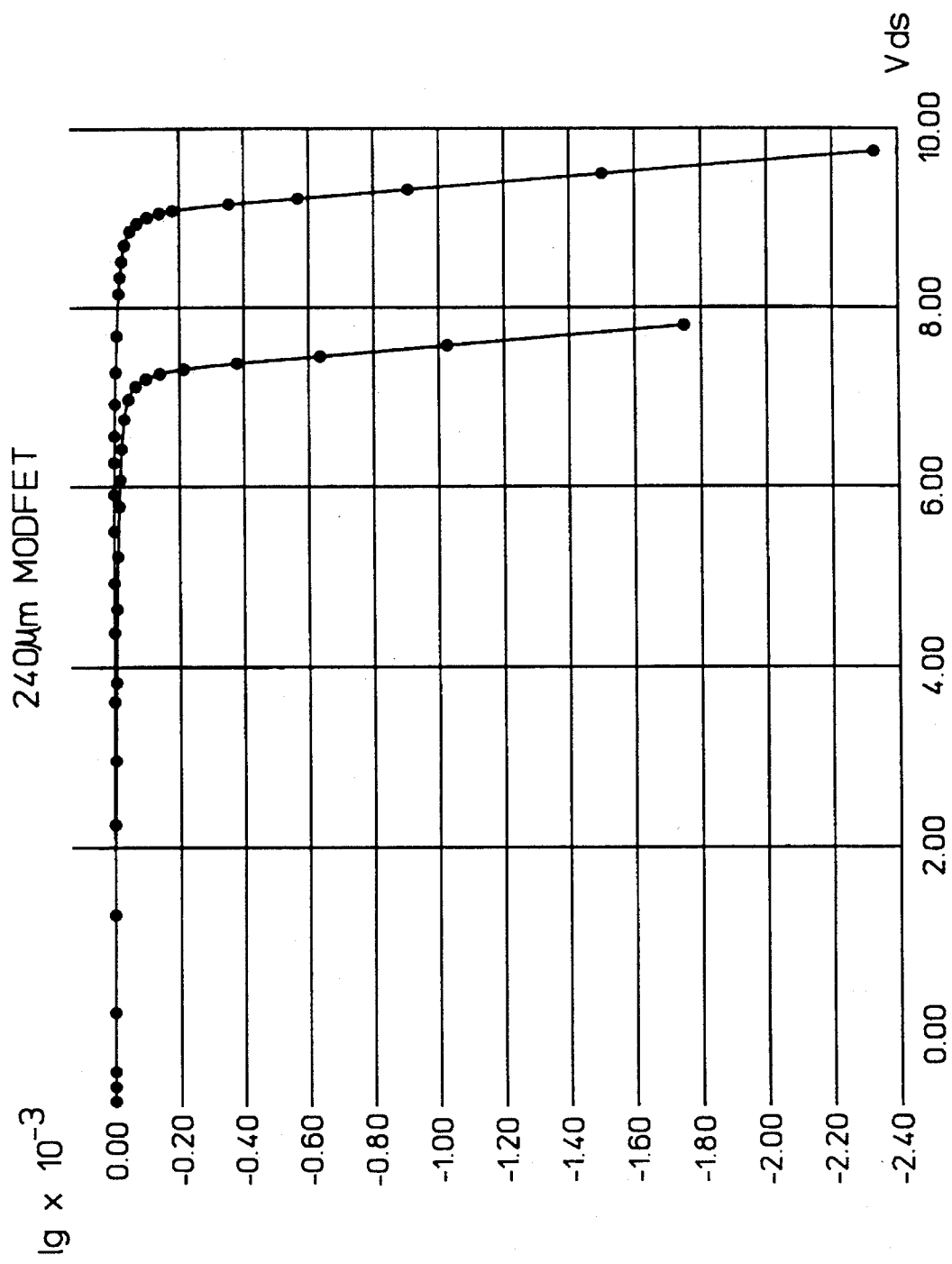
FIG. 8 illustrates the gate current, $I_G$, at the beginning of soft gate-drain breakdown of a 240 μm MODFET.

FIG. 7 illustrates how the d.c. I-V transfer curves of a 500 μm MESFET can be sampled by the automated data acquisition system 72 in accordance with the invention. The point density is higher near the knee of the curves, where the nonlinearities are changing most rapidly. The maximum extrinsic drain-to-source voltage, $V_{DS}$, values for each extrinsic gate-to-source voltage, $V_{GS}$, curve are determined automatically by the power compliance mechanism. For curves at moderate negative values of $V_{GS}$, the density of data points increases again at about $V_{DS} = 10$ V. This is due to the beginning of soft gate-drain breakdown, more evident from examining the gate current, $I_G$, of a 240 μm MODFET, as shown in FIG. 8. The maximum $V_{DS}$ values at $V_{GS} < V_p \approx 2.2$ V were limited by reverse gate breakdown current compliance. FIG. 8 shows the distribution of data points along gate current curves in the breakdown region, illustrating that the density of points is greatest where the nonlinearities change the most.

The automated data acquisition system 72 in accordance with the invention also provides conventional setups to perform "cold FET" measurements for subsequent determination of parasitic elements. The automated data acquisition system 72 also can be used with great advantage to provide a complete, optimum set of data for the conventional extraction of standard circuit simulation models, as well.

Figure 9:
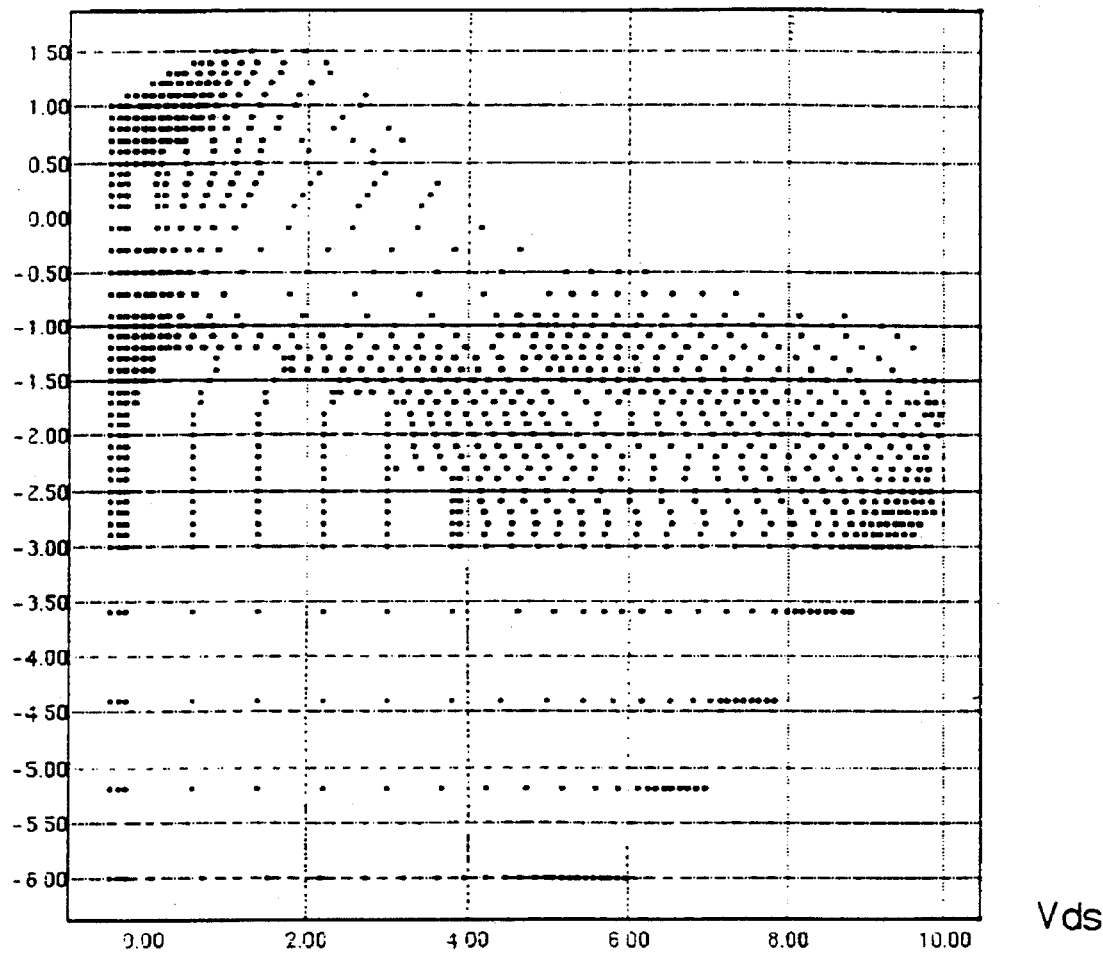
FIG. 9 illustrates the specific bias voltage points selected and measured by the automated data acquisition system in accordance with the invention for a 240 μm MODFET.

FIG. 9 illustrates the specific bias voltage points selected and measured by the automated data acquisition system 72 for a 240 μm MODFET. In general, the boundary of this region, for $V_{DS} > 0$ V, has a complicated, curved shape. These results are achieved by defining relevant hardware compliance limits as functions of the specific bias voltage point to be measured. Each bias voltage point has its own compliance limit built in.

The bias-dependent compliances are calculated from the data sheet information. The pseudo code which implements the basic algorithm is shown in Appendix II.

Parasitic inductances and resistances, such as $R_G$ and $L_G$, are characterized once by forward biasing the FET under the conditions $I_G \approx 200$ mA/mm and $I_D = -I_G/2$. The latter condition guarantees the device is passive. See Hughes, B., and Tasker, P. J., "Bias Dependence of the MODFET Intrinsic Model Element Values at Microwave Frequencies," *IEEE Trans. on Electron Devices*, ED-36 (10), 1989, pages 2267–2273. It is important to characterize the total port d.c. resistances so that the d.c. measurements can be calibrated to the FET pads, as can the S-parameter measurements using conventional radio-frequency calibration. This is provided by measuring the effective resistance of a short. The results are incorporated into the model data file 86 shown in FIG. 5. The nonlinear circuit simulator 88 shown in FIG. 5 is preferably an HP 85150B microwave design system.

The automated data acquisition system 72 in accordance with the invention, which adaptively acquires data within an automatically determined safe operation range, is advantageously used in connection with the measurement-based FET model generated as described above. However, the techniques presented here can easily be applied for characterizing other classes of active semiconductor devices, or else used to provide better sampled data for conventional parameter extraction techniques on FETs.

Figure 10A:
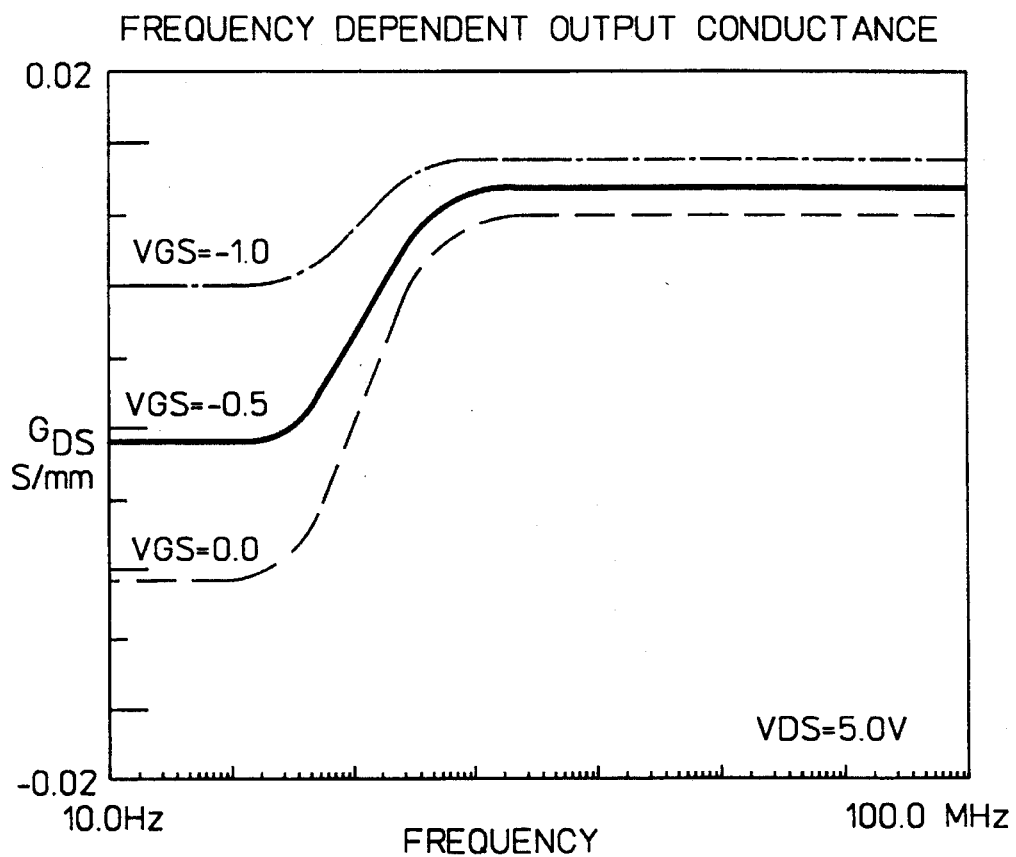
FIG. 10A illustrates simulated output conductance, $G_{DS}$, at $V_{DS}$=5 V versus frequency at three different gate voltages for an exemplary 600 μm MESFET.
Figure 10B:
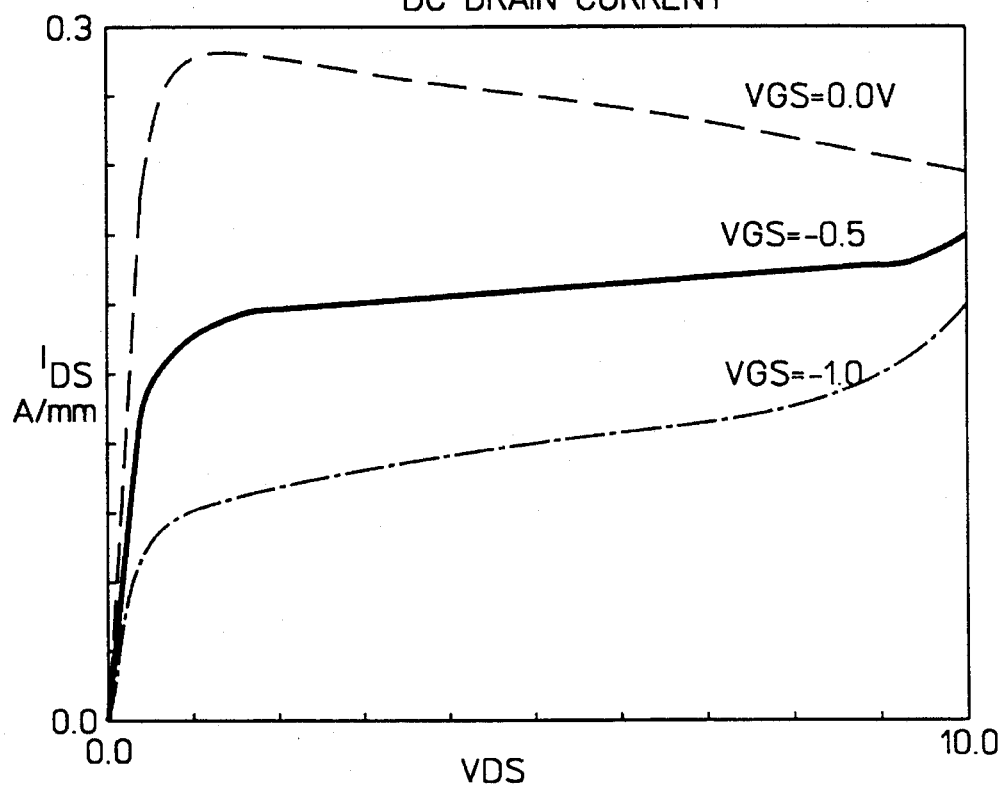
FIG. 10B illustrates d.c. transfer curves for a 600 μm MESFET at the three different gate voltages shown in FIG. 10A.

FIG. 10A illustrates the simulated output conductance, $G_{DS}$, at $V_{DS}=5$ V versus frequency at three different gate voltages for a 600 μm MESFET. FIG. 10B shows the d.c. transfer curves at these same gate voltages. At very low frequencies, $G_{DS}$ is numerically equal to the slope of the d.c. I-V transfer curves at $V_{DS}=5$ V. This slope is negative for $V_{GS}=0$ V. As the frequency increases, the output conductance $G_{DS}$ becomes positive at each gate bias, increasing to the correct high-frequency microwave value. The calculation time for a complete large-signal model from measured d.c. and S-parameter data at over 1,000 controlling bias voltage points is less than 60 seconds using a Hewlett-Packard Company Model HP 375 workstation.

Verification of the measurement-based model in accordance with the invention using large-signal data will now be described. Large-signal, device-level verification can be described by comparing the measurement-based model provided in accordance with the method of the invention, three industry-standard MESFET models, and measured performance data, at several operating points and loading conditions.

Figure 12B:
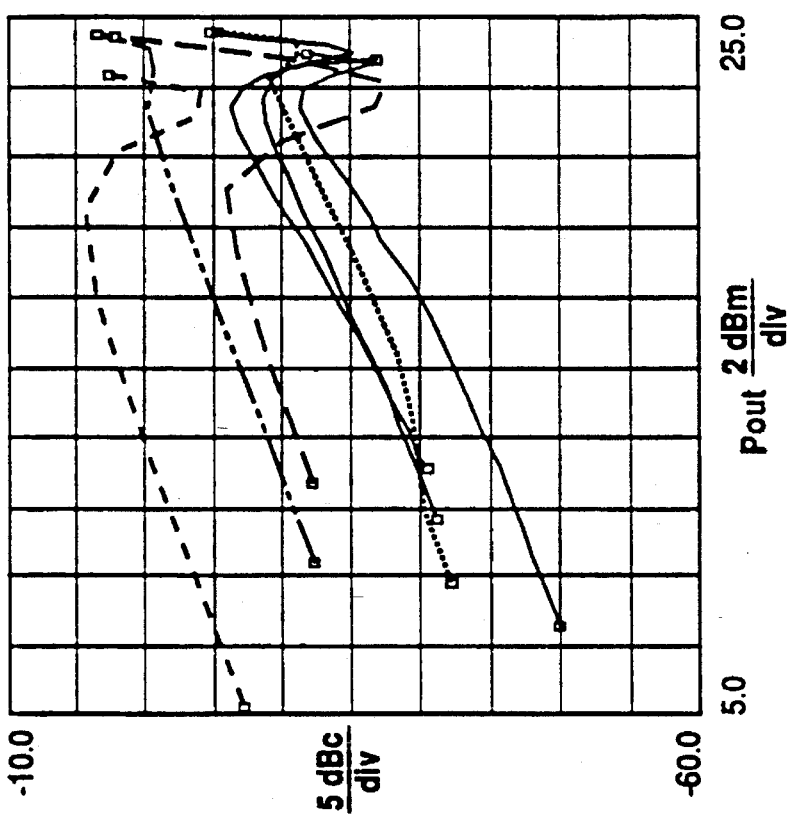
Figure 12A:
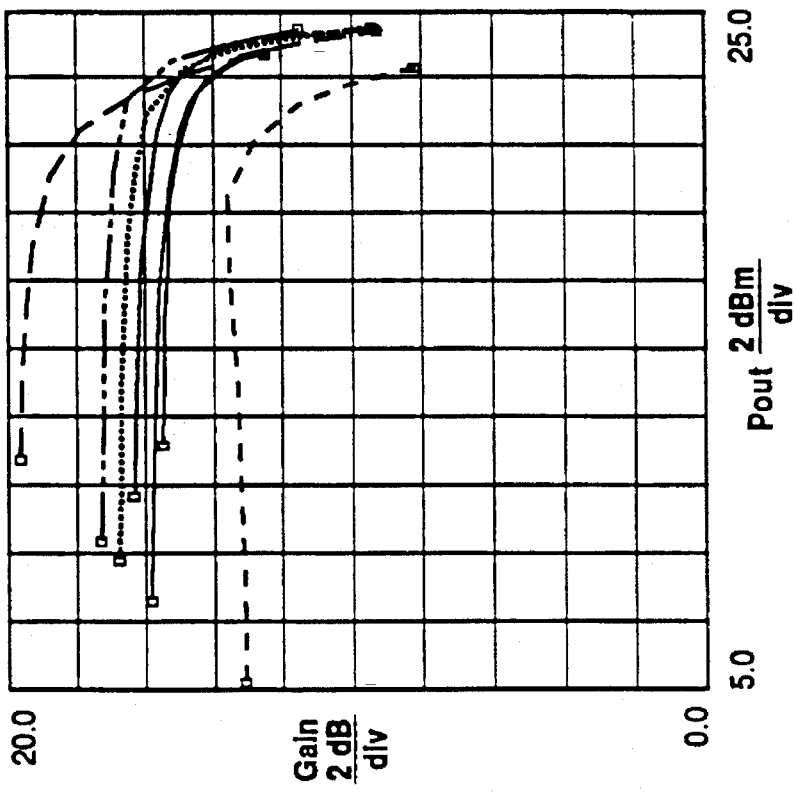
Figure 13B:
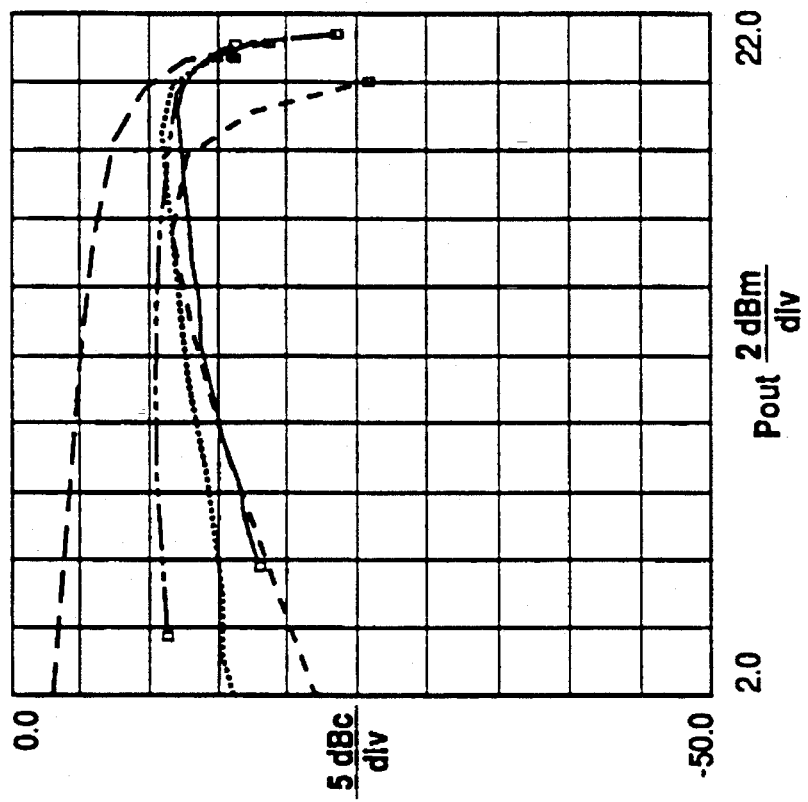
Figure 13A:
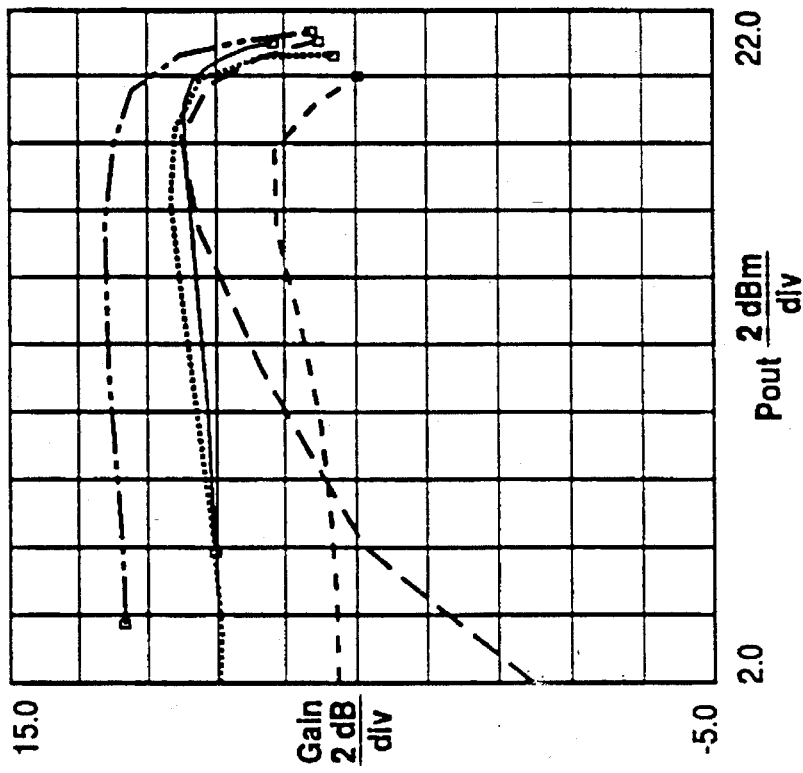
Figures 13C, 13D:
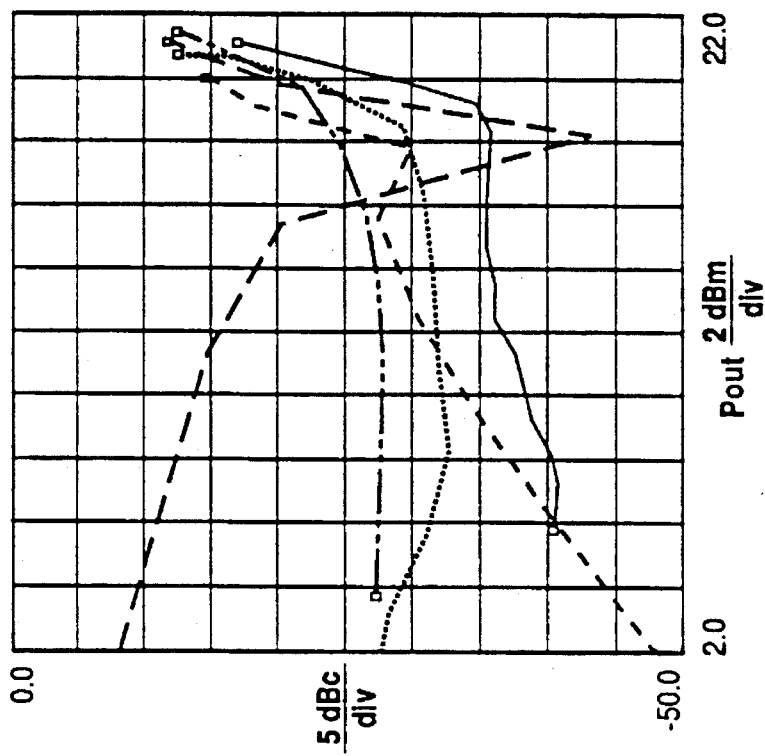

FIGS. 11 through 13 compare measured large-signal data to harmonic balance simulations using the large-signal model in accordance with the invention and three representative industry-standard MESFET models described in Curtice, W. R., "A MESFET Model for Use in the Design of GaAs Integrated Circuits," *IEEE Trans. Microwave Theory and Techniques,* MTT-28 (5), 1980, pages 448–456; Curtice, W. R., and Ettenberg, M., "A Nonlinear GaAs FET Model for Use in the Design of Output Circuits for Power Amplifiers," *IEEE Trans. MTT*-33, 12, 1985, pages 1383–1393; and Statz, et al., "GaAs FET Device and Circuit Simulation in SPICE," *IEEE Trans. Electron Devices ED*-34, No. 2, 1987, pages 160–169, respectively. All simulations were performed with the Model HP 85150B microwave design system.

The models were extracted from the same 0.4 μm×600 μm MESFET device using the HP IC-CAP program. Despite d.c. and S-parameter simulations of the standard models being in very good agreement with the data used for extractions, the large-signal model in accordance with the invention is seen to be superior overall in its large-signal predictions compared to the industry-standard MESFET models. d.c. and S-parameter simulations of the standard models are seen to be in very good agreement with the measured performance data used for the extractions.

The gain compression and harmonic measurements were performed on four equivalent 0.4 μm×600 μm MESFETs, but with attenuators at the ports. The attenuators were designed and experimentally verified to present fixed impedances of either 50 or 100 ohms at the device output at the harmonics generated by the device. Three different operating points and two loading conditions were selected for the comparisons. The fundamental frequency is 2 GHz in all cases. The measurement-based model in accordance with the invention is seen to be superior overall in its large-signal predictions compared to the representative industry-standard MESFET models.

Figure 14:
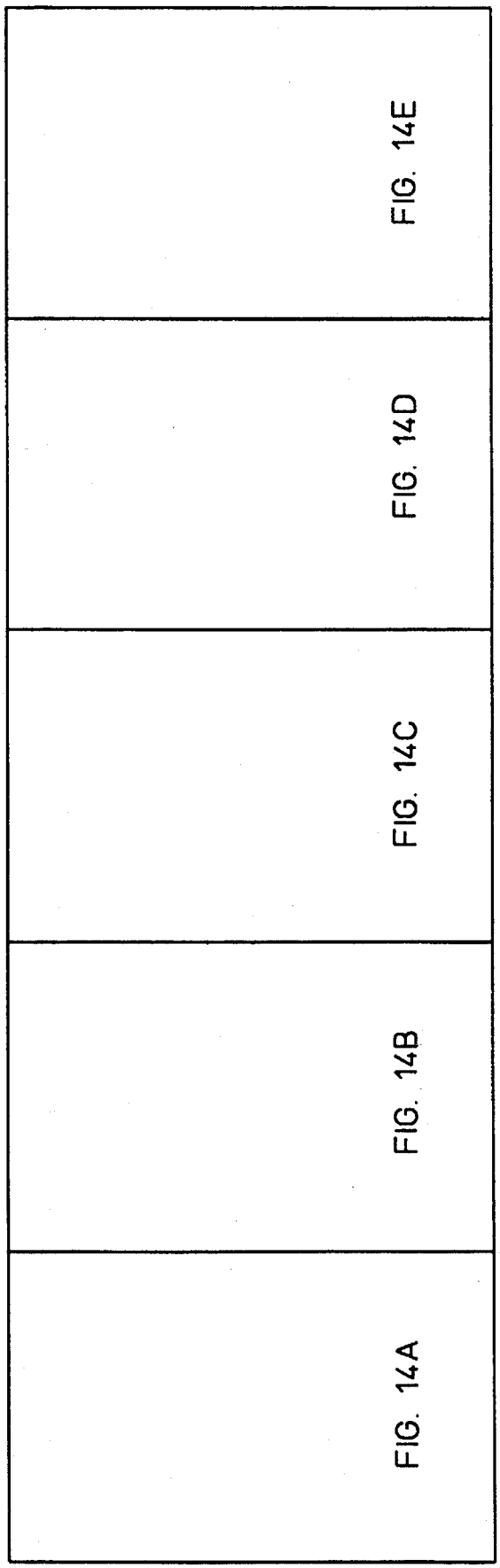
FIG. 14 is a schematic diagram of an exemplary MODFET distributed amplifier with 14 FETs.
Figure 14A:
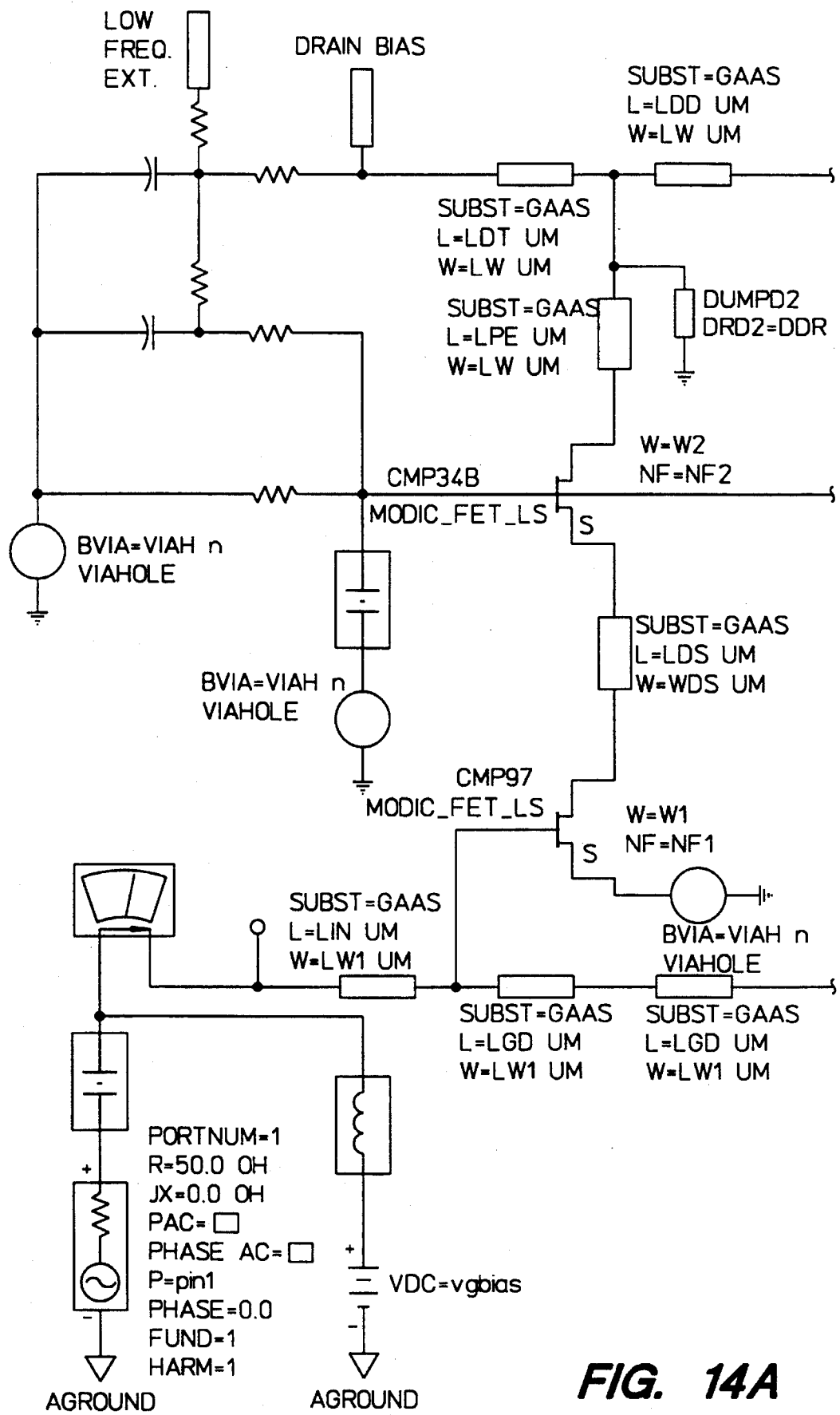
Figure 14B:
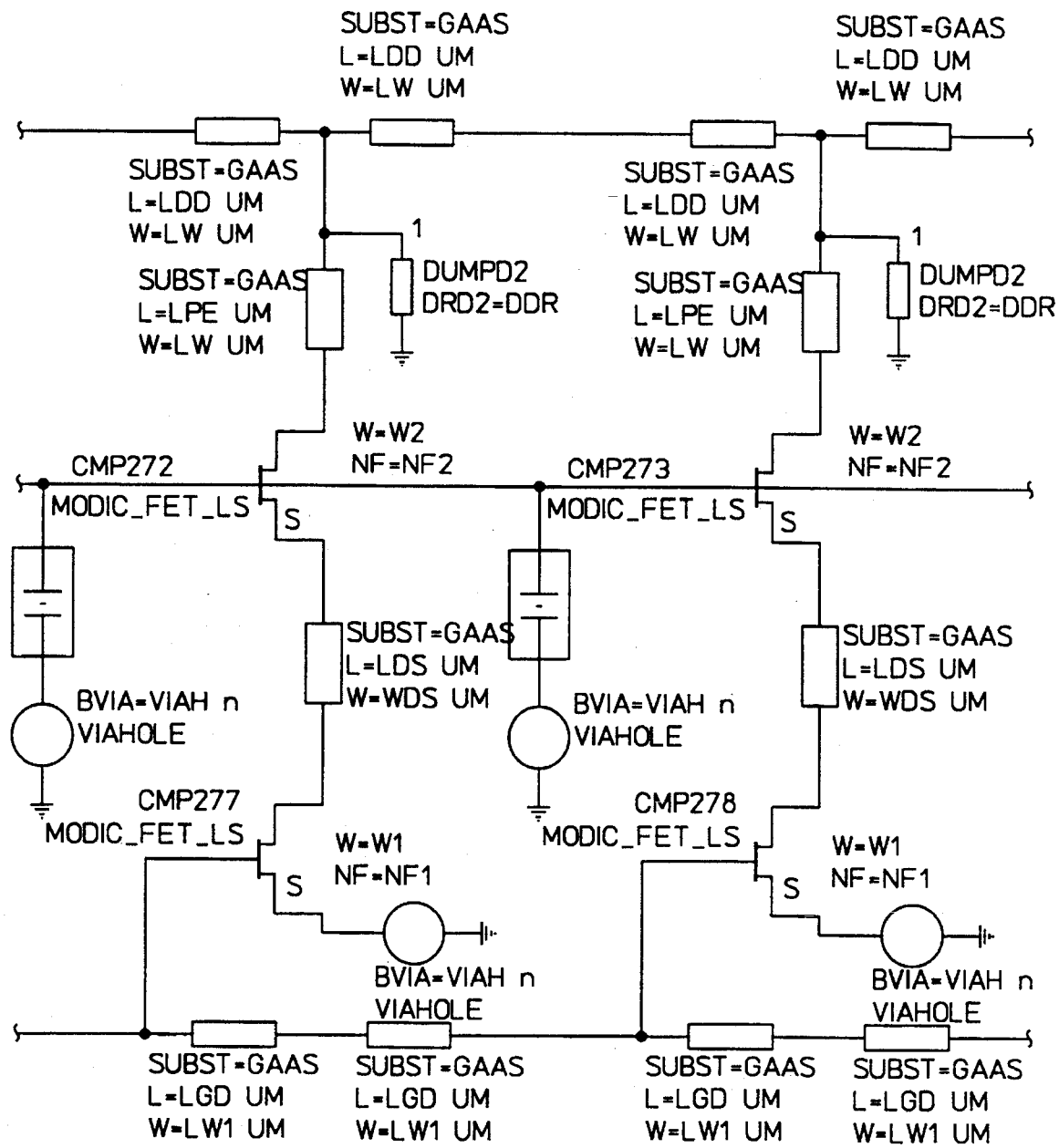
Figure 14C:
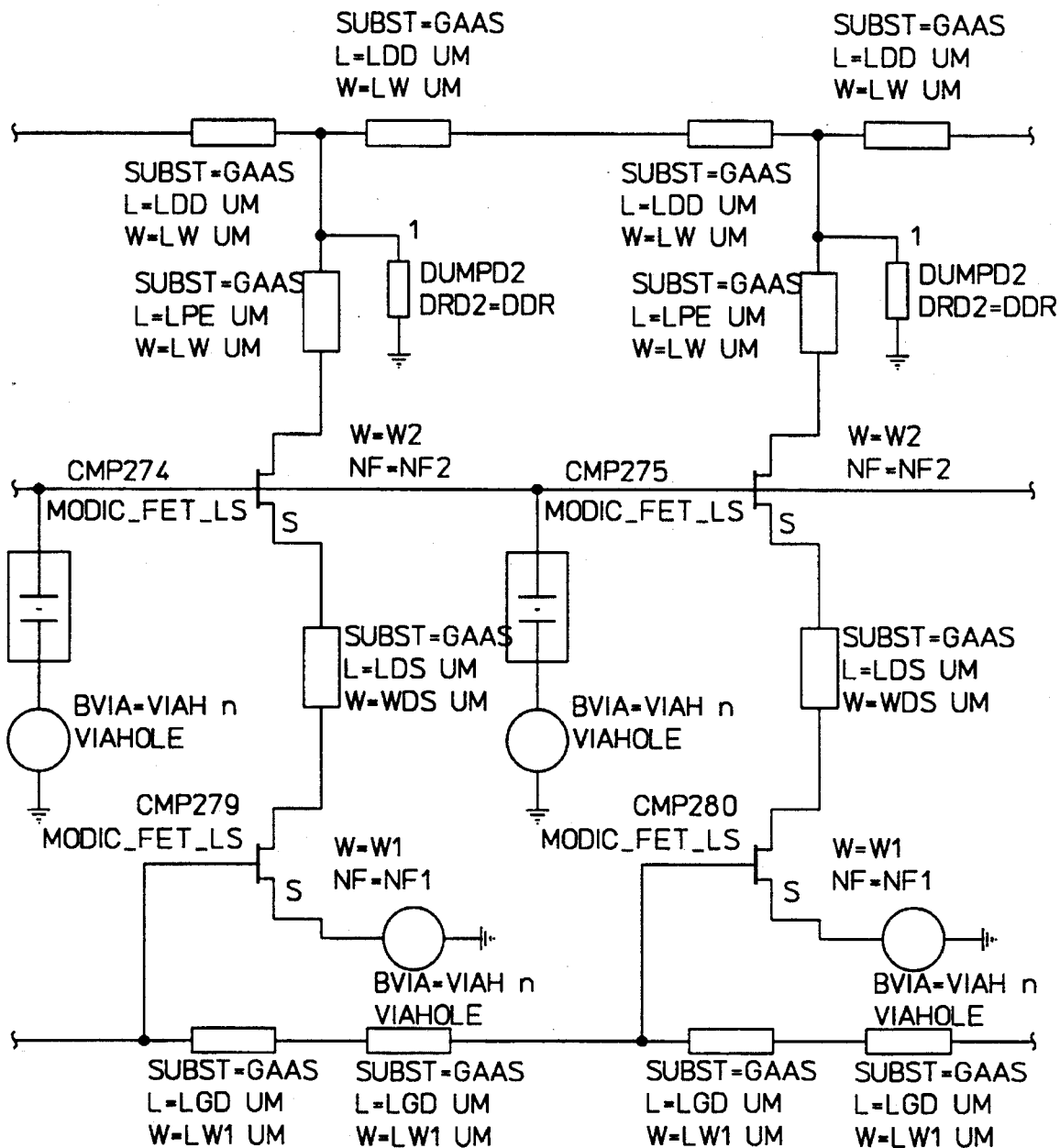
Figure 14D:
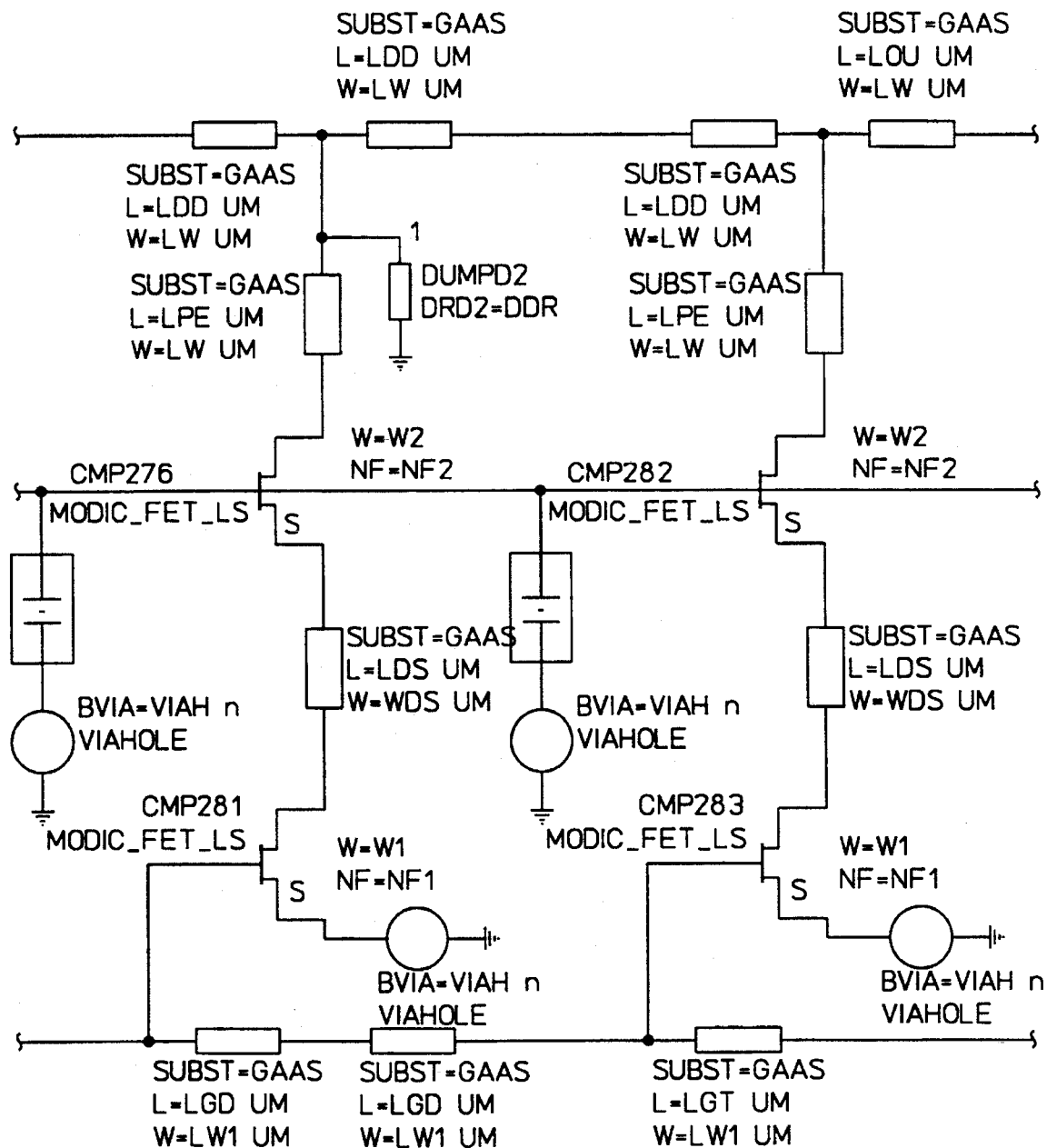
Figure 14E:
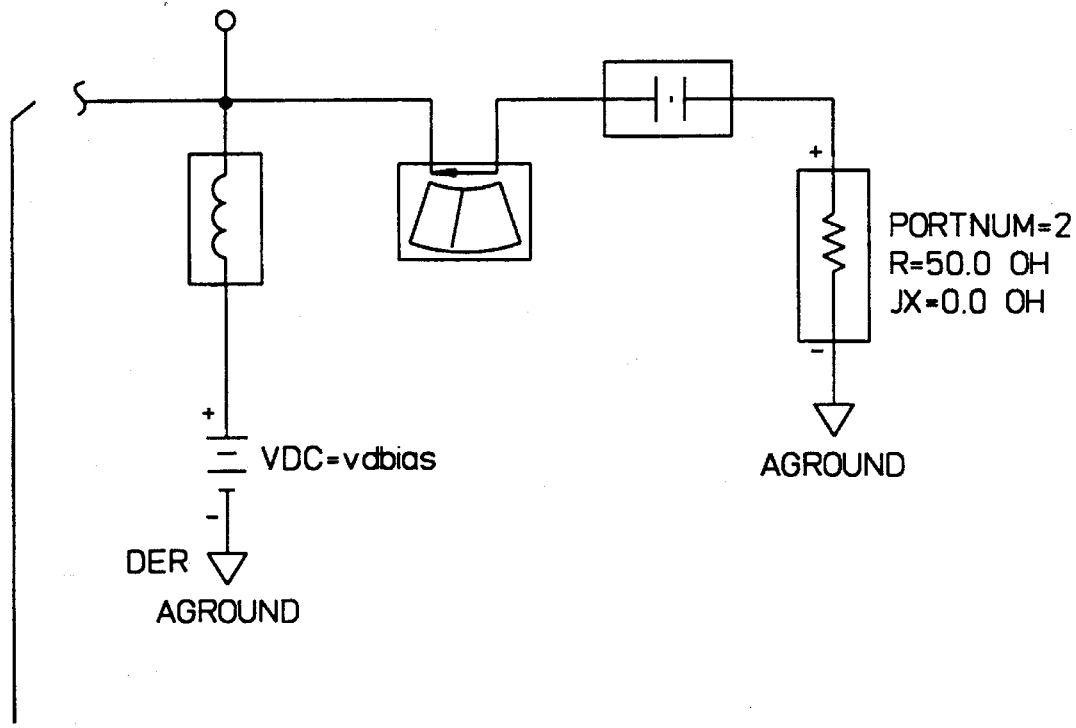
Figure 14E:
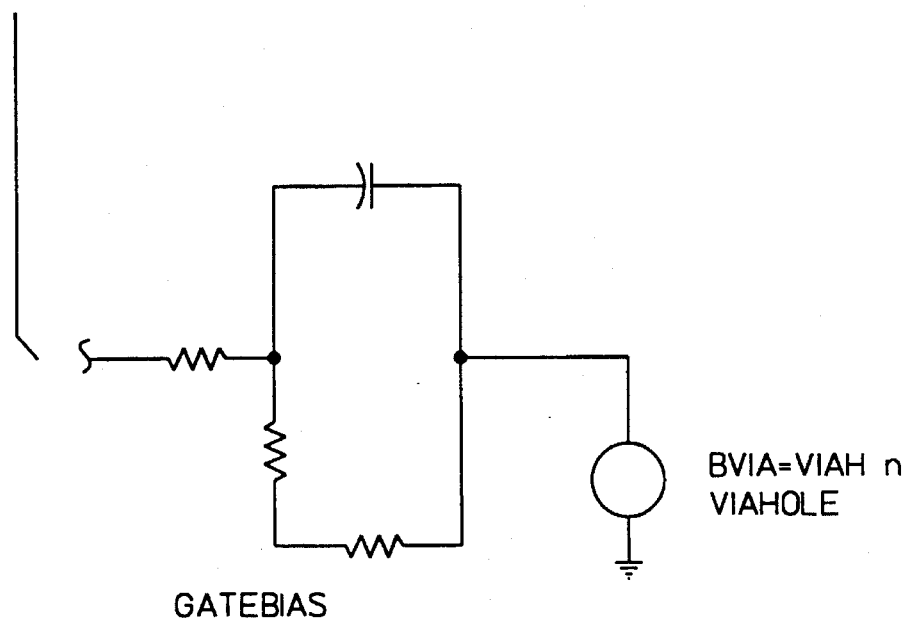
Figure 15B:
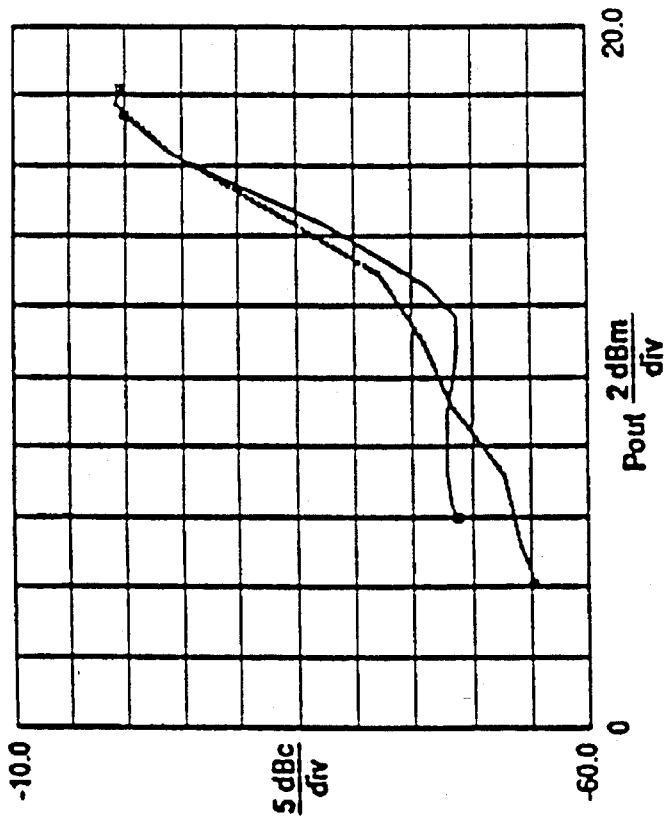
FIG. 15 is a comparison of measured performance data for the MODFET distributed amplifier shown in FIG. 14 and performance of the same amplifier simulated using the measurement-based model in accordance with one embodiment of the invention.
Figure 15A:
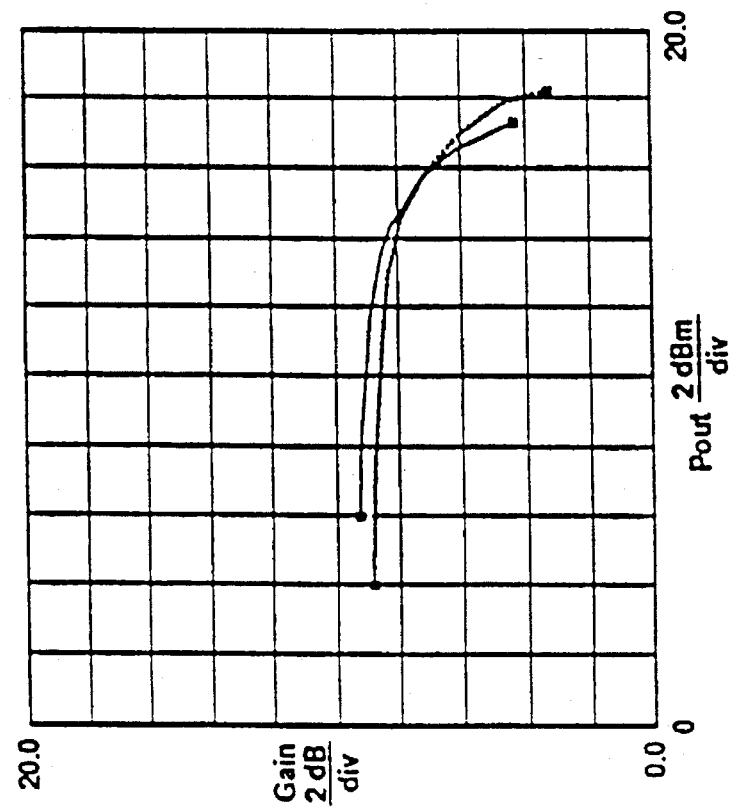
Figures 15C, 15D:
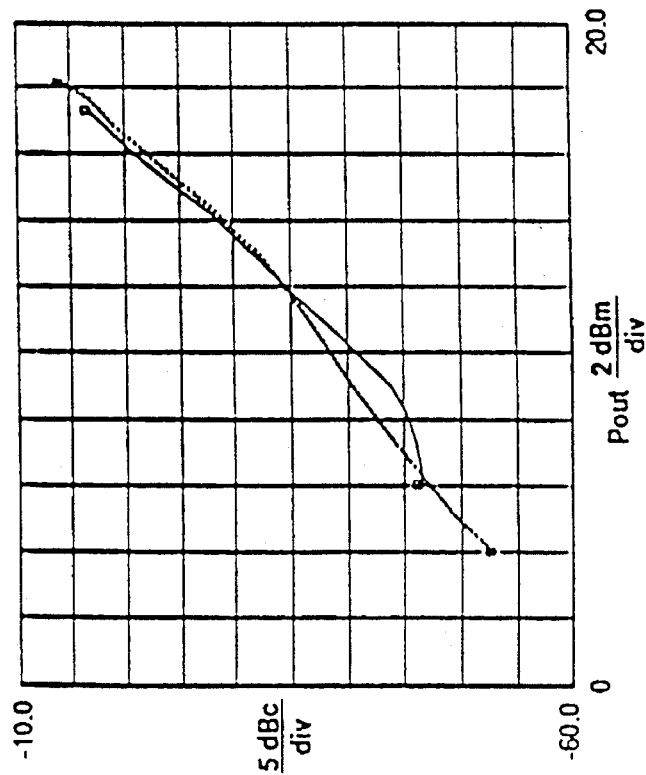

Finally, circuit-level verification is demonstrated by comparing the model simulations in accordance with the invention to measured large-signal performance of a MODFET distributed amplifier with 14 FETs described in Perdomo, J., et al., "A Monolithic 0.5 to 50 GHz Distributed Amplifier with 6 dB Gain," *GaAs IC Symposium Technical Digest,* 1989, pages 91–94. The schematic diagram of the circuit is shown in FIG. 14. Measured and simulated results are compared for the 14 MODFET distributed amplifier. The MODFETs in the design are 48 μm wide with two gate fingers. The comparison of measured and simulated performance is shown in FIG. 15. The model was extracted from the above 240 μm MODFET devices with four gate fingers. This demonstrates that the model in accordance with the method of the invention is indeed independent of the technology on which the FET design is based, and is applicable to MODFETs as well as MESFETs. The excellent results verify the model scaling rules over a factor of five in total gate width.

The invention provides an accurate, technology-independent, large-signal model for an active semiconductor device, such as a GaAs FET. A fast and convenient model-generation procedure replaces the need for conventional parameter extraction by directly calculating the relevant nonlinearities from device data. An automated data acquisition system, which adaptively samples data within an automatically determined safe operating range is provided to obtain needed response data. The compiled model in the nonlinear circuit simulator, the automated model generator system, and the automated data acquisition system form an integrated CAE system for state-of-the-art nonlinear circuit design. The model has been demonstrated to yield more accurate predictions of large-signal device performance than conventional MESFET models over the range of applied controlling bias voltages and loading conditions. The model exhibits excellent agreement with large-signal measurements of active semiconductor devices and electronic circuits which incorporate such devices, such as a distributed MODFET amplifier comprising 14 FETs.

The foregoing description is offered primarily for purposes of illustration. While a variety of embodiments of a measurement-based modeling system has been disclosed, it will be readily apparent to those skilled in the art that numerous other modifications are contemplated. For example, empirical models and the model in accordance with the invention can be limited by the measured performance data used in the parameter-extraction or model-generation process, respectively. With some modifications, it is possible to construct the model from d.c. and S-parameter data versus controlling bias voltages supplemented with pulsed measurements. This extends the range over which active semiconductor devices can be safely characterized, and more accurately represents the effective nonlinearities of some devices when operated under pulsed conditions. Additionally, it is possible to construct ("feed") the tables of the measurement-based model in accordance with the invention from semiconductor-physics-based device simulations, rather than from actual measurements. This allows the circuit consequences of new materials, device structures, and processes to be explored in the event that only a design for the active semiconductor device, rather than the actual physical device, is available. Also, other modifications and variations not mentioned above can still be made without departing from the spirit and scope of the invention as claimed below.

Appendix I
Data Acquisition Algorithm

```
begin:
Vgate = Vgstart;
while (Vgate less than Vgstop)
   Vdrain = Vdstart, take first dc measurement
   while (not within the compliances)
    increase Vdrain by min_step, take dc measurement
   end while
   store 1st point. h1 = min_step, Vdrain = Vdrain + h1, take dc measurement
   if (2nd point is within the compliances)
     store the data, h2 = h1, Vdrain = Vdrain + h2, take dc measurement
     if (3nd point is within the compliances)
        compute predicted step for 3nd pt from (I")old
        while (Vdrain less than Vdstop and is within the compliances)
          take dc measurement
          if ((current above noise level)and (within the compliances))
              computer (I")new vs vds using last 3 points.
            if ((I") change the sign)
                compute predicted step from I'" using last 4 points
            else
                computer predicted step hp from (I")new
              if (hp < h2)
                choose step = hp < min_step ? min_step:hp
                take dc measurement
              else
                keep hp = h2
              take ac measurement save the point
              keep second derivtive
          end if
            update the numberin, 2->1,3->2, start from 3nd as 1st
            h1 = h2; h2 = hp, Vdrain = Vdrain + hp
        end while
     end if
   end if
   update Vgs
end while
```

Appendix II

```
If Vdrain ≥ 0.0
       If Power/(Vdrain(1 + ε_c)) > Ilimit
            Complia_Id = Ilimit;
       Else
            Complia_Id = Power/(Vdrain(1 + ε_c));
   If Vgate ≤ 0.0
            Complia_Ig = IBrk;
       Else
            Complia_Ig = IFwd;
   Else
   If Power/(Vdrain(1 − ε_c)) < −1.0;
            Complia_Id = Ilimit;
       Else
            Complia_Id = − Power/(Vdrain(1 − ε_c));
   If Vgate − Vdrain ≤ 0.0
            Complia_Ig = IBrk;
       Else
            Complia_Ig = IFwd;
   End
```

In the above expressions, $\epsilon_c$ is a small number (1.0E−6). The value of Ilimit depends upon the hardware. For the high-current HP 4142 d.c. source/monitor 82, Ilimit=1.0 A.

What is claimed is:

1. A modeling method for an active semiconductor device, comprising the steps of:

providing dynamic equations which define a model of an active semiconductor device for a nonlinear circuit simulator, in terms of functions to be calculated from measured response data and a frequency parameter $\omega_t$ to be specified during simulation;

providing branch equations for voltage re-referencing to the dynamic equations which define a large-signal model of the active semiconductor device for the nonlinear circuit simulator, defined in terms of functions to be measured;

providing a measurement system for generating stimuli and measuring responses to applied stimuli;

measuring series port resistances of the measurement system;

connecting terminals of the active semiconductor device to the measurement system;

measuring S-parameters versus frequency at the terminals of the active semiconductor device with the measurement system;

calculating parasitic device resistances and parasitic device inductances for the active semiconductor device;

measuring S-parameters versus applied, measured controlling bias voltages at at least one frequency and d.c. terminal transfer curves versus applied biases over a predetermined operating range of biases of the active semiconductor device with the measurement system;

calculating an intrinsic Y-matrix of the active semiconductor device by linear de-embedding of the parasitic device resistances and inductances previously calculated;

calculating state functions for the large-signal model, referenced to an applied, measured voltage space defined by the applied, measured controlling bias voltages; and writing a model file, containing tabulated state function values, measurement series port resistances, and calculated parasitic values.

2. The method of claim 1 wherein the active semiconductor device is a field effect transistor (FET), further comprising the steps of:

selecting a total gate width and number of parallel gate fingers of the FET to be simulated and the parameter $\omega_t$;

selecting the model file to be referenced by the nonlinear circuit simulator for a simulation; and simulating the model in the nonlinear circuit simulator.

3. The method of claim 1 wherein the step of measuring S-parameters versus applied, measured controlling bias voltages at at least one frequency and d.c. terminal transfer curves versus applied biases over a predetermined operating range of biases of the active semiconductor device comprises calculating current compliances to maintain measurements within a safe region of device operation.

4. The method of claim 1 wherein the active semiconductor device is a field effect transistor (FET), wherein the step of writing a model file further comprises the step of:

including total gate width and number of parallel gate fingers of the FET for scaling rules.

5. The method of claim 1 wherein the active semiconductor device is a field effect transistor (FET), wherein S-parameters versus frequency are measured at forward bias voltage conditions, and wherein the step of calculating state functions for the large-signal model, referenced to the applied, measured voltage space, comprises calculating state functions according to equations 1–11 as follows: T,530 where $\omega$ is a measured angular frequency, $V_{GS}{}^m$ is a gate-to-source voltage measured at the terminals of the FET, $V_{DS}{}^m$ is a drain-to-source voltage measured at the terminals of the FET, $Q_i$ (i=G, D) are charge functions for nonlinear capacitors at the gate and drain of the FET, $R_i$ (i=G, D, S) are parasitic resistances at the gate, drain, and source terminals of the FET, $C_{ij}$ are intrinsic FET capacitances, $g_m$ is intrinsic FET transconductance, $g_D$ is intrinsic FET drain conductance, $Y_{ij}$ is the intrinsic Y-matrix of the FET, $I_i{}^{high}$ (i=D) is a high-frequency current state function for drain current of the FET, and $R_1$ and $R_2$ are series port resistances of the measurement system.

6. The method of claim 5, further comprising the steps of:

selecting a total gate width and number of parallel gate fingers of the FET to be simulated and the parameter $\omega_t$;

selecting the model file to be referenced by the nonlinear circuit simulator for a simulation; and simulating the model in the nonlinear circuit simulator.

7. The method of claim 5 wherein the step of measuring S-parameters versus applied, measured controlling bias voltages at at least one frequency and d.c. terminal transfer curves versus applied biases over a predetermined operating range of biases of the active semiconductor device comprises calculating current compliances to maintain measurements within a safe region of device operation.

8. The method of claim 5 wherein the step of writing a model file further comprises the step of:

including total gate width and number of parallel gate fingers of the FET for scaling rules.

9. A measurement-based modeling and simulation system for an active semiconductor device, comprising:

an automated data acquisition system for measuring response data to construct model equations, the automated data acquisition system determining controlling bias voltages at which to measure responses of an active semiconductor device and collecting d.c. and small-signal S-parameter response data;

a model generator connected to the automated data acquisition system for receiving the d.c. and small-signal S-parameter response data, the model generator for calculating nonlinear intrinsic model functions directly from the measured response data and creating a look-up table;

a model data file connected to the model generator for storing the look-up table; and a nonlinear circuit simulator connected to the model data file for simulating the active semiconductor device.

10. The measurement-based modeling and simulation system of claim 9, wherein the automated data acquisition system calculates current compliances to maintain measurements within a safe region of operation of the active semiconductor device based on predetermined parameters.

11. The measurement-based modeling and simulation system of claim 10 wherein the automated data acquisition system has an input, the input being provided specifications about the active semiconductor device, the automated data acquisition system automatically computing the safe operating range of the active semiconductor device from the specifications.

12. The measurement-based modeling and simulation system of claim 11 wherein the active semiconductor device is a field effect transistor (FET) and the specifications comprise maximum gate current compliance and maximum power dissipation of the FET.

13. The measurement-based modeling and simulation system of claim 10 wherein the automated data acquisition system measures response data adaptively within the safe operating range depending upon the specific nonlinearities of the active semiconductor device such that response data points are selected more densely where nonlinearities are severe, such as knees of I-V curves and onset of breakdown, and less densely where characteristics are not changing rapidly.

14. The measurement-based modeling and simulation system of claim 13 wherein the automated data acquisition system estimates local degree of nonlinearity of d.c. currents and selects a density of sampling points accordingly, and, after predicting a next measurement point, acquires the response data and recalculates the local degree of nonlinearity.

15. The measurement-based modeling and simulation system of claim 9 wherein the automated data acquisition system comprises:

a network analyzer;

a d.c. source/monitor connected to the network analyzer;

an S-parameter test set connected to the network analyzer and to the active semiconductor device; and a synthesizer connected to the network analyzer and to the S-parameter test set for stimulating the active semiconductor device.

16. The measurement-based modeling and simulation system of claim 9 wherein the model generator comprises a computer executing HP_UX.

17. The measurement-based modeling and simulation system of claim 9 wherein the nonlinear circuit simulator is a microwave design system.

\* \* \* \* \*